(12) United States Patent
Furukawa et al.

(10) Patent No.: US 7,074,271 B2
(45) Date of Patent: Jul. 11, 2006

(54) METHOD OF IDENTIFYING DEFECT DISTRIBUTION IN SILICON SINGLE CRYSTAL INGOT

(75) Inventors: Jun Furukawa, Tokyo (JP); Kazunari Kurita, Tokyo (JP); Kazuhiro Harada, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 366 days.

(21) Appl. No.: 10/784,411

(22) Filed: Feb. 23, 2004

(65) Prior Publication Data

US 2005/0183660 A1 Aug. 25, 2005

(51) Int. Cl.
*C30B 15/20* (2006.01)
(52) U.S. Cl. ............................. 117/13; 117/14; 117/15; 117/20; 117/202; 117/932
(58) Field of Classification Search ................. 117/13, 117/14, 15, 20, 201, 202, 932
See application file for complete search history.

(56) References Cited

U.S. PATENT DOCUMENTS 5,418,172 A * 5/1995 Falster et al. ............... 438/17
6,638,357 B1 * 10/2003 Mule'Stagno et al. ......... 117/2
2001/0025597 A1 * 10/2001 Falster et al. ................. 117/13
2003/0116081 A1 * 6/2003 Falster et al. ................. 117/13
2004/0025782 A1 * 2/2004 Falster et al. ................. 117/3
2005/0238905 A1 * 10/2005 Falster et al. ............... 428/620

* cited by examiner

Primary Examiner—Robert Kunemund
(74) Attorney, Agent, or Firm—Reed Smith LLP

(57) ABSTRACT

A surface of a reference sample is contaminated with a transition metal, and a heat treatment is performed to diffuse the transition metal in the sample. A concentration of recombination centers formed by the transition metal is measured in the entire heat-treated reference sample, and a region [V], a region [Pv], a region [Pi], and a region [I] in the reference sample are defined based on the values measured. Meanwhile, recombination lifetimes associated with the transition metal are measured in the entire heat-treated reference sample. Based on both of the measurement results, a correlation line of the concentration of recombination centers and the recombination lifetimes is produced. A surface of the measurement sample is contaminated with the transition metal, and a heat treatment is performed to diffuse the transition metal in the sample. Recombination lifetimes associated with the transition metal are measured in the entire heat-treated measurement sample, and the values measured are checked against the correlation line to infer the region [Pv] and the region [Pi] as well as the boundary thereof in the measurement sample.

13 Claims, 22 Drawing Sheets

(a)

(b)

(c)

(a)

(b)

(b) OISF region (P band region) [V] [Pv] $V_1$ (a) [Pi] [I] B band region $V_2$

Crosses (×) indicate inflextion points for respective regions.

Crosses (×) indicate inflextion points for respective regions.

Crosses (×) indicate inflextion points for respective regions.

METHOD OF IDENTIFYING DEFECT DISTRIBUTION IN SILICON SINGLE CRYSTAL INGOT

TECHNICAL FIELD

The present invention relates to a method of identifying defect distribution in a silicon single crystal ingot (hereinafter referred to as an "ingot") pulled according to a Czochralski method (hereinafter referred to as a "CZ method"). Particularly, the invention relates to a method of identifying a grown-in defect free region in an ingot in which the concentration of oxygen dissolved in the ingot is $1.2 \times 10^{18}$ atoms/cm$^3$ (old ASTM, likewise hereinafter) or higher, or $9.0 \times 10^{17}$ atoms/cm$^3$ or lower, and to a method of identifying a grown-in defect-free region in a low-oxygen concentration ingot in which the concentration of oxygen dissolved in the ingot is within the range of $8.0 \times 10^{17}$ to $1.0 \times 10^{18}$ atoms/cm$^3$.

BACKGROUND OF THE INVENTION

With the recent trend of super-miniaturization in semiconductor integrated circuits, it has been suggested that reduction in device yield arises from the presence of crystal originated particle (hereinafter referred to as "COP"), microdefects of oxygen precipitates that become the nuclei of oxidation induced stacking fault (hereinafter referred to as "OISF"), interstitial-type large dislocation (hereinafter referred to as "L/D"), and the like.

COP is a pit originated from a crystal that appears on a wafer surface when the silicon wafer that has undergone a mirror polishing is subjected a SC-1 rinse with the use of a mixed solution of ammonia and hydrogen peroxide. When the wafer is measured with a particle counter, the pit is detected as a particle (light point defect, LPD). The COP becomes a cause of deteriorating electrical characteristics such as time dependent dielectric breakdown (TDDB) characteristic and time zero dielectric breakdown (TZDB) characteristic of oxide films. In addition, COP existing on a wafer surface can create a height difference in a wiring process of devices, which can become a cause of wire breakage. In addition, it becomes a cause of leakage or the like in the element-isolating portions, lowering product yield.

It is considered that OISF originates from micro oxygen precipitates formed during crystal growth, which form the nuclei thereof; and it is a stacking fault that is exposed during a thermal oxidation process or the like in the manufacture of semiconductor devices. This OISF becomes a cause of faults in devices, such as an increase in leakage current. L/D is also called dislocation cluster, or dislocation pit, because a silicon wafer having this defect forms an etching pit having an orientation when it is immersed in a selective etchant solution including hydrofluoric acid as a main component. This L/D also becomes a cause of deteriorating electrical characteristics, such as leakage characteristics, isolation characteristics, and the like.

For the reasons stated above, it has been necessary to reduce COP, OISF and L/D defects in silicon wafers used in the manufacture of semiconductor integrated circuits.

U.S. Pat. No. 6,045,610 and the corresponding Japanese Unexamined Patent Publication No. 11-1393 discloses a defect-free ingot that does not have these COP, OISF, and L/D, and a silicon wafer sliced from the ingot. This defect-free ingot is an ingot composed of a perfect region [P], where [P] is a perfect region in which neither agglomerates of vacancy-type point defects nor agglomerates of interstitial silicon-type point defects are detected in an ingot. The perfect region [P] exists between a region [V] and a region [I] in an ingot; in the region [V], vacancy-type point defects are predominant and defects in which supersaturated vacancies are agglomerated are contained, whereas in the region [I], interstitial silicon-type point defects are predominant and defects in which supersaturated interstitial silicons are agglomerated are contained.

Japanese Unexamined Patent Publication No. 2001-102385 shows that the perfect region [P], which does not have defects in which point defects are agglomerated, is classified into a region [Pv] in which vacancy-type point defects are predominant and a region [Pi] in which interstitial silicon-type point defects are predominant. The region [Pv] is a region that is adjacent to the region [V] and has a concentration of vacancy-type point defects that is less than the minimum concentration of vacancy-type point defects at which an OISF nucleus can be formed. The region [Pi] is a region that is adjacent to the region [I] and has a concentration of interstitial silicon-type point defects less than the minimum concentration of interstitial silicon-type point defects at which an interstitial-type large dislocation can be formed.

The ingot composed of the perfect region [P] is produced within the range of a V/G ratio (mm$^2$/minute·° C.) such that OISF (P band) generated in a ring-like shape during a thermal oxidation treatment disappears from the central area of the wafer and that L/D (B band) does not occur, where the pull rate of the ingot is V (mm/minute) and the temperature gradient with respect to the ingot's axial direction in the vicinity of the solid-liquid interface between the silicon melt and the silicon ingot is G (° C./mm).

Conventionally, the following method has been adopted in order to measure a distribution of secondary defects generated in an ingot by a heat treatment, that is, agglomerated defects, over the axial direction and over the diametric directions of the ingot. First, an ingot is sliced in the axial direction to prepare samples. Then, these samples are subjected to a mirror etching, are then heat-treated at 800° C. for 4 hours in a nitrogen or oxidizing atmosphere, and are subsequently further heat-treated at 1000° C. for 16 hours. The heat-treated samples are measured with the use of such methods as copper decoration, Secco-etching, X-ray topography analysis, and lifetime measurement. Generally, the density of the oxygen precipitates formed in a sample by a heat treatment is substantially proportionate to the concentration of oxygen. When the concentration of oxygen dissolved in an ingot is less than $1.2 \times 10^{18}$ atoms/cm$^3$ and more than $9.0 \times 10^{17}$ atoms/cm$^3$, oxygen precipitates appear at a high density in the ingot due to the heat treatment and therefore the foregoing methods are capable of clearly distinguishing a region [V], a P band, a region [Pv], a region [Pi], a B band, and a region [I].

However, when the concentration of oxygen dissolved in an ingot is low and less than $1.0 \times 10^{17}$ atoms/cm$^3$, such as in the case of the ingot that is pulled with a magnetic field being applied according to an MCZ (magnetic-field-applied CZ) method, the density of the oxygen precipitates that occur due to the heat treatment is not sufficiently high. For this reason, the above-described conventional method suffers from a problem in that those regions cannot be distinguished clearly. For example, when recombination lifetimes are measured subsequent to a heat treatment, the difference between the measurement value of the recombination lifetime in the region [Pv] and the measurement value of the recombination lifetime in the region [Pi] becomes smaller in a sample having a low oxygen concentration than in a sample having high oxygen concentration. For this reason, there has been a drawback in that the boundary between the region [Pv] and the region [Pi] cannot be distinguished clearly with samples having low oxygen concentrations. Moreover, depending on conditions of the heat treatment, the boundary between the region [Pv] and the region [Pi] shifts toward either the region [Pv] side or the region [Pi] side. This is attributed to the fact that the density and size of the oxygen precipitates change in the sample depending on heat treatment conditions. For this reason, it has been difficult to measure real point defect regions at high precision. In addition, when the concentration of oxygen dissolved in the ingot is not more than $9.0 \times 10^{17}$ atoms/cm$^3$, it has been impossible to clearly distinguish the boundary between the region [Pv] and the region [Pi], and moreover, it has been difficult to clearly measure the P band, which corresponds to the boundary between the region [V] and the region [Pv], and the B band, which corresponds to the boundary between the region [Pi] and the region [I].

Furthermore, when the concentration of oxygen dissolved in the ingot is high, $1.2 \times 10^{18}$ atoms/cm$^3$ or higher, the density of the oxygen precipitates that appear due to the heat treatment is too high; therefore, with the above-described conventional methods, it has been difficult to precisely measure the P band, which corresponds to the boundary between the region [V] and the region [Pv].

It is a first object of the present invention to provide a method of easily identifying the region [Pv] and the region [Pi] in an ingot as well as the boundaries thereof even when the concentration of oxygen contained in the ingot is low.

It is a second object of the present invention to provide a method of identifying a defect distribution in a silicon single crystal ingot, by which the boundary between the region [Pv] and the region [V] in an ingot can be easily identified even when the concentration of oxygen dissolved in the ingot is high.

It is a third object of the present invention to provide a method of identifying defect distribution in a silicon single crystal ingot that easily identifies both the boundary between the region [V] and the region [Pv] and the boundary between the region [Pi] and the region [I] in the ingot even when the concentration of oxygen dissolved in the ingot is low.

SUMMARY OF THE INVENTION

A first aspect of the present invention pertains first and third identification methods, and it is a method of identifying a point defect distribution in a silicon single crystal ingot, including the steps of: (a) slicing a first silicon single crystal ingot in an axial direction thereof, the ingot pulled from a first silicon melt at a varying pull rate, to prepare a reference sample including a region [V], a region [Pv], a region [Pi], and a region [I]; (b) coating a surface of the reference sample with a transition metal solution in which a transition metal is dissolved at a concentration of 1 to 1000 ppm to metal-contaminate the reference sample; (c) heat-treating the metal-contaminated reference sample in an atmosphere of argon, nitrogen, oxygen, hydrogen, or a mixed gas thereof either at temperatures of 600 to 1200° C. for 0.5 to 24 hours while increasing the temperature at a rate of 0.5 to 10° C./minute, or at temperatures of 600 to 1100° C. for 10 to 60 seconds while increasing the temperature at a rate of 30 to 70° C./second, to diffuse the transition metal in the reference sample; (d) measuring a concentration of recombination centers formed by the transition metal in the entire heat-treated reference sample; (e) measuring recombination lifetimes associated with the transition metal in the entire heat-treated reference sample; (f) producing a correlation line between the concentration of recombination centers and the recombination lifetimes from measurement results obtained in the step (d) and the step (e), and defining regions including at least the region [Pv] and the region [Pi] as well as a boundary thereof in the reference sample; (g) slicing a second silicon single crystal ingot, in an axial direction thereof, the second silicon single crystal ingot pulled from a second silicon melt at a predetermined pull rate, to prepare a measurement sample including at least a region [Pv] and a region [Pi]; (h) coating a surface of the measurement sample with the same transition metal solution as the transition metal solution to metal-contaminate the measurement sample; (i) heat-treating the metal-contaminated measurement sample under the same conditions as those in the step (c) to diffuse the transition metal in the measurement sample; (j) measuring a recombination lifetime associated with the transition metal in the entire heat-treated measurement sample; and (k) checking results of the measuring in the step (j) against the correlation line to infer the region [Pv] and the region [Pi] as well as a boundary thereof.

The above-described reference sample and measurement sample that have been sliced are such that an oxygen concentration thereof is within the range of $8.0 \times 10^{17}$ to $1.0 \times 10^{18}$ atoms/cm$^3$, or that a boundary between the region [Pv] and the region [Pi] is unidentifiable in the samples when their recombination lifetimes are measured after the samples are heat-treated at 800° C. for 4 hours in a nitrogen atmosphere and subsequently further heat-treated at 1000° C. for 16 hours. The region [V] is a region in which vacancy-type point defects are predominant and defects in which excessive vacancies are agglomerated are contained, the region [Pv] is a region in which vacancy-type point defects are predominant and defects in which vacancies are agglomerated are not contained, the region [Pi] is a region in which interstitial silicon-type point defects are predominant and defects in which interstitial silicons are agglomerated are not contained, and the region [I] is a region in which interstitial silicon-type point defects are predominant and defects in which interstitial silicons are agglomerated are contained.

The first aspect according to the invention has been accomplished based on the following findings. Although easy and convenient, the methods of measuring recombination lifetime that are represented by an LM-PCD (laser/microwave photoconductivity decay) method cannot identify the region [Pv] and the region [Pi] as well as the boundary thereof in a sample having a low oxygen concentration that have undergone a predetermined heat treatment. On the other hand, the methods of measuring a concentration of recombination centers that are represented by a DLTS (deep level transient spectroscopy) method can identify the region [Pv] and the region [Pi] as well as the boundary thereof in a sample having a low oxygen concentration that has undergone a predetermined heat treatment, although they require many process steps and much time for the measurement. The present inventors have taken notice that there is a correlation between measurement values that are obtained by the DLTS method for a reference sample pulled at a varying rate and measurement values that are obtained by the LM-PCD method for the reference sample. Specifically, the boundaries between respective regions are identified in a reference sample using the DLTS method, and a calibration line is produced from the correlation. For a measurement sample pulled at a predetermined rate, the recombination lifetime is measured using the LM-PCD method that is easy-to-use, and the measured values are applied to the calibration line to obtain the concentration of recombination centers. From the obtained concentration of recombination centers, the regions in the measurement sample are inferred.

A second aspect of the present invention pertains to second and fourth identification methods, and it is a method of identifying a point defect distribution in a silicon single crystal ingot, including the steps of: (a) slicing a first silicon single crystal ingot in an axial direction thereof, the first silicon single crystal ingot pulled from a first silicon melt at a varying pull rate, to prepare first and second reference samples each including a region [V], a region [Pv], a region [Pi], and a region [I]; (b) coating each of surfaces of the first and second reference samples with first and second transition metal solutions in which respective different transition metals are dissolved at a concentration of 1 to 1000 ppm to metal-contaminate the reference samples; (c) heat-treating the metal-contaminated first and second reference samples in an atmosphere of argon, nitrogen, oxygen, hydrogen, or a mixed gas thereof either at temperatures of 600 to 1200° C. for 0.5 to 24 hours while increasing the temperature at a rate of 0.5 to 10° C./minute, or at temperatures of 600 to 1100° C. for 10 to 60 seconds while increasing the temperature at a rate of 30 to 70° C./second, to diffuse the transition metals in the first and second reference samples; (d) measuring a concentration of recombination centers formed by the transition metal in the entire heat-treated first reference sample; (e) measuring recombination lifetimes associated with the transition metal in the entire heat-treated second reference sample; (f) producing a correlation line between the concentration of recombination centers and the recombination lifetimes from measurement results obtained in the step (d) and the step (e), and defining regions including at least the region [Pv] and the region [Pi] as well as a boundary thereof in the first reference sample; (g) slicing a second silicon single crystal ingot in an axial direction thereof, the second silicon single crystal ingot pulled from a second silicon melt at a predetermined pull rate, to prepare a measurement sample including at least a region [Pv] and a region [Pi]; (h) coating a surface of the measurement sample with a third transition metal solution that is the same as the second transition metal solution to metal-contaminate the measurement sample; (i) heat-treating the metal-contaminated measurement sample under the same conditions as those in the step (c) to diffuse the transition metal in the measurement sample; (j) measuring a recombination lifetime associated with the transition metal in the entire heat-treated measurement sample; and (k) checking results of the measuring in the step (j) against the correlation line to infer the region [Pv] and the region [Pi] as well as a boundary thereof.

The sliced first and second reference samples and the measurement sample are such that an oxygen concentration thereof is within the range of $8.0 \times 10^{17}$ to $1.0 \times 10^{18}$ atoms/cm$^3$, or a boundary between the region [Pv] and the region [Pi] is unidentifiable in the samples when their recombination lifetimes are measured after the samples are heat-treated at 800° C. for 4 hours in a nitrogen atmosphere and subsequently further heat-treated at 1000° C. for 16 hours. The definitions of the region [V], the region [Pv], the region [Pi], and the region [I] are the same as those set forth in the foregoing first aspect.

A third aspect of the present invention pertains to fifth identification method, and it is a method of identifying a point defect distribution in a silicon single crystal ingot, including the steps of: (a) slicing a silicon single crystal ingot in an axial direction thereof, the ingot pulled from a silicon melt at a varying pull rate, to prepare first and second samples each including a region [V], a region [Pv], a region [Pi], and a region [I]; (b) measuring oxygen concentrations of the first and second samples; (c) subjecting the first sample to a first heat treatment at 800° C. for 4 hours in a nitrogen or oxidizing atmosphere and subsequently to a second heat treatment at 1000° C. for 16 hours, when the oxygen concentrations of the first and second samples are $1.2 \times 10^{18}$ atoms/cm$^3$ or higher; (d) measuring recombination lifetimes in the entire heat-treated first sample; (e) defining a boundary between the region [Pi] and the region [I] in the first sample based on measurement results in the step (d); (f) subjecting the second sample to a third heat treatment at 1100 to 1200° C. for 1 to 4 hours in an oxidizing atmosphere; (g) selectively etching the second sample subjected to the third heat treatment; (h) observing the selectively-etched second sample with an optical microscope to identify an oxidation induced stacking fault (OISF) region; and (i) defining a boundary between the region [V] and the region [Pv] in the second sample based on a result of the observing in the step (h).

The definitions of the region [V], the region [Pv], the region [Pi], and the region [I] are the same as those set forth in the foregoing first aspect.

In accordance with the third aspect of the invention, employing the above-described method makes it possible to easily identify the boundary between the region [Pv] and the region [V] in an ingot from the distribution of OISF even when the concentration of oxygen dissolved in the ingot is a high concentration of $1.2 \times 10^{18}$ atoms/cm$^3$ or higher.

A fourth aspect of the present invention pertains to a sixth identification method, and it is a method of identifying a point defect distribution in a silicon single crystal ingot, including the steps of: (a) slicing a silicon single crystal ingot in an axial direction thereof, the ingot pulled from a silicon melt at a varying pull rate, to prepare first and second samples each including a region [V], a region [Pv], a region [Pi], and a region [I]; (b) measuring oxygen concentrations of the first and second samples; (c) subjecting the first sample to a third heat treatment at 1100 to 1200° C. for 1 to 4 hours in an oxidizing atmosphere when the oxygen concentrations of the first and second samples are $9.0 \times 10^{17}$ atoms/cm$^3$ or lower; (d) selectively etching the first sample that has been subjected to the third heat treatment; (e) observing the selectively-etched first sample with an optical microscope to identify an oxidation induced stacking fault (OISF) region; (f) defining a boundary between the region [V] and the region [Pv] in the first sample based on a result of the observing in the step (e); (g) selectively etching the second sample; (h) observing the selectively-etched second sample with an optical microscope to identify an interstitial-type large dislocation region; and (i) defining a boundary between the region [Pi] and the region [I] in the second sample based on a result of the observing in the step (h).

The definitions of the region [V], the region [Pv], the region [Pi], and the region [I] are the same as those set forth in the foregoing first aspect.

A fifth aspect of the present invention pertains to a seventh identification method, and it is a method of identifying a point defect distribution in a silicon single crystal ingot, including the steps of: (a) slicing a silicon single crystal ingot in an axial direction thereof, the ingot pulled from a silicon melt at a varying pull rate, to prepare first and second samples each including a region [V], a region [Pv], a region [Pi], and a region [I]; (b) measuring oxygen concentrations of the first and second samples; (c) subjecting the first sample to a first heat treatment at 800° C. for 4 hours in a nitrogen or oxidizing atmosphere and subsequently to a second heat treatment at 1000° C. for 16 hours, when the oxygen concentrations of the first and second samples are $9.0 \times 10^{17}$ atoms/cm$^3$ or less; (d) measuring recombination lifetimes in the entire heat-treated first sample; (e) defining a boundary between the region [Pi] and the region [I] and a boundary between the region [V] and the region [Pv] in the first sample based on measurement results in the step (d); (f) subjecting the second sample to a fourth heat treatment at 700° C. to not more than 800° C. for 4 to 20 hours or at 800° C. for more than 4 to 20 hours in a nitrogen or oxidizing atmosphere and subsequently to a fifth heat treatment at 1000° C. for 1 to 20 hours; (g) measuring recombination lifetimes in the entire heat-treated second sample; and (h) defining a boundary between the region [Pi] and the region [I] and a boundary between the region [V] and the region [Pv] in the second sample based on measurement results in the step (g).

The definitions of the region [V], the region [Pv], the region [Pi], and the region [I] are the same as those set forth in the foregoing first aspect.

In accordance with the fourth and fifth aspects of the invention, employing the above-described methods makes it possible to easily identify the boundary between the region [V] and the region [Pv] and the boundary between the region [Pi] and the region [I] even when the oxygen dissolved in an ingot is a low concentration of $9.0 \times 10^{17}$ atoms/cm$^3$ or lower.

BRIEF DESCRIPTION OF THE DRAWINGS

FIG. 8 is a graph in which FIG. 6 and FIG. 7 are combined;

Figure 1:
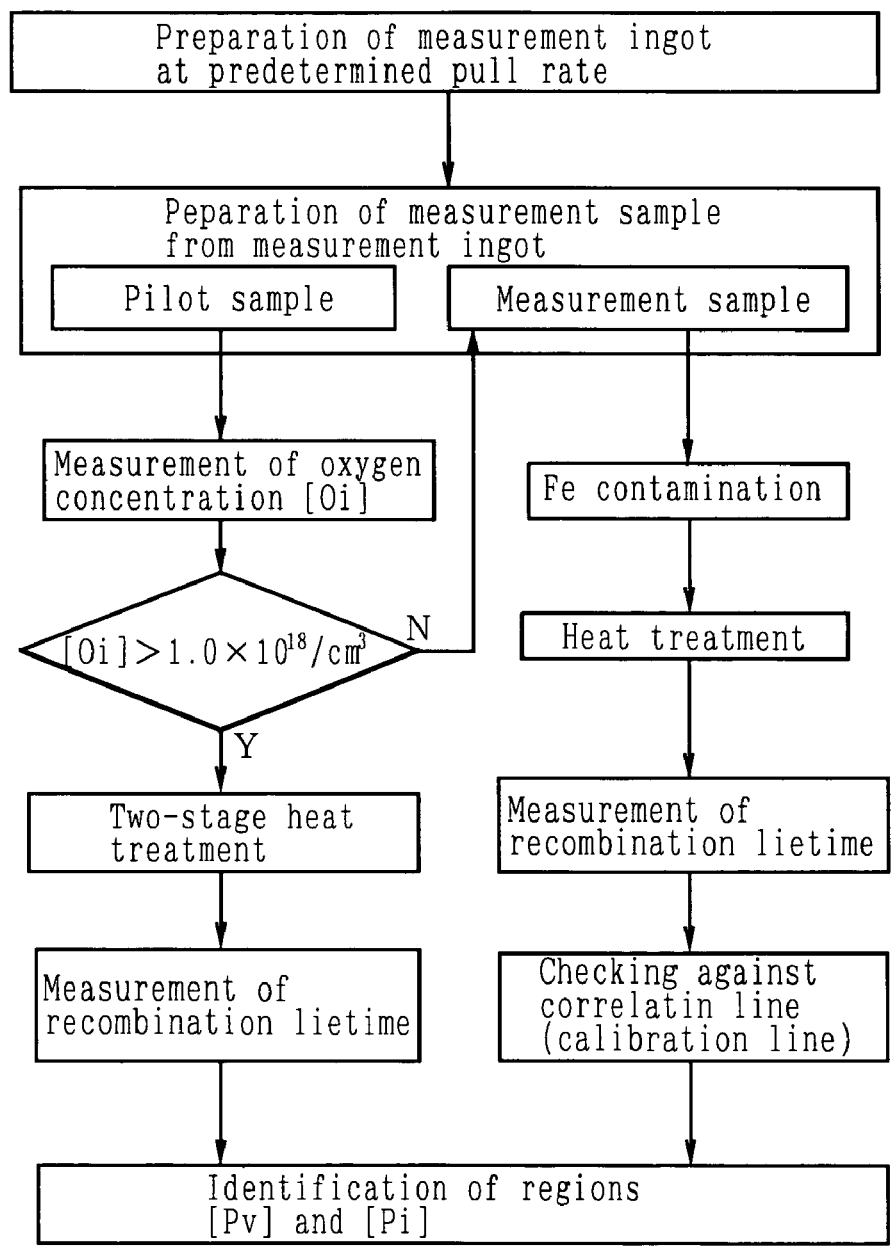
FIG. 1 is a flowchart pertaining to a measurement sample in a first identification method according to the present invention.

DETAILED DESCRIPTION OF THE INVENTION (1) Ingots that are the Subject of Identification Methods According to the Present Invention The ingots that are the subject of first to fourth identification methods according to the present invention are pulled while controlling a V/G ratio such that the ingots include at least the region [Pv] and the region [Pi]. In addition, these ingots are either such ingots that their oxygen concentration is in the range of $8.0 \times 10^{17}$ to $1.0 \times 10^{18}$ atoms/cm$^3$ (old ASTM, likewise hereinafter), or such ingots that the boundary between the region [Pv] and the region [Pi] cannot be identified in the samples sliced from these ingots when recombination lifetimes are measured after the samples are heat-treated at 800° C. for 4 hours in a nitrogen atmosphere and subsequently further heat-treated at 1000° C. for 16 hours.

The ingots that are the subject of a fifth identification method according to the present invention are pulled while controlling a V/G ratio such that the ingots include the region [V], the region [Pv], the region [Pi], and the region [I]. In addition, these ingots are either such ingots that their oxygen concentration is $1.2 \times 10^{18}$ atoms/cm$^3$ (old ASTM, likewise hereinafter) or higher, or such ingots that the boundary between the region [V] and the region [Pv] in the samples sliced from these ingots cannot be identified when recombination lifetime are measured after the samples are heat-treated at 800° C. for 4 hours in a nitrogen or oxidizing atmosphere and subsequently further heat-treated at 1000° C. for 16 hours.

The ingots that are the subject of sixth and seventh identification methods according to the present invention are pulled while controlling a V/G ratio such that the ingots contain the region [V], the region [Pv], the region [Pi], and the region [I]. In addition, these ingots are either such ingots that their oxygen concentration is $9.0 \times 10^{17}$ atoms/cm$^3$ (old ASTM, likewise hereinafter) or lower, or such ingots that the boundary between the region [Pi] and the region [I] cannot be identified in the samples sliced from these ingots when the recombination lifetime of the samples are measured after the samples are heat-treated at 800° C. for 4 hours in a nitrogen or oxidizing atmosphere and subsequently further heat-treated at 1000° C. for 16 hours.

These ingots are pulled from a silicon melt in a hot-zone furnace using a CZ method or an MCZ method according to Voronkov's theory. Generally, when a silicon single crystal ingot is pulled from a silicon melt in a hot zone furnace using a CZ method or an MCZ method, point defects and agglomerates of point defects (three-dimensional defects) are caused as defects in a silicon single crystal. Of the point defects, there are two common types, vacancy-type point defect and interstitial silicon-type point defect. In a vacancy-type point defect, one of the silicon atoms is detached from one of their normal positions in a silicon crystal lattice. Agglomerated vacancies of this kind form vacancy-type defects. On the other hand, interstitial silicons that have agglomerated form interstitial silicon-type defects.

Generally, point defects are introduced at a contact surface between a silicon melt (molten silicon) and an ingot (solid silicon). However, as the ingot is pulled, the portion that has been the contact surface is gradually cooled while the ingot is continuously pulled. During the cooling, vacancies or interstitial silicons undergo diffusion and a pair annihilation reaction. At the time when cooled to about 1100° C., excessive point defects form agglomerates of vacancy-type defects (vacancy agglomerates) or agglomerates of interstitial silicon-type defects (interstitial agglomerates). In other words, they are three-dimensional structures originated from excessive point defects forming agglomerates.

Agglomerates of vacancy-type defects include the defects referred to as LSTD (Laser Scattering Tomograph Defects) or FPD (Flow Pattern Defects), other than the previously-described COP. The agglomerates of interstitial silicon-type defects include defects referred to as L/D, which have been mentioned previously. FPD is a source of traces exhibiting a peculiar flow pattern, which is exposed when a silicon wafer prepared by slicing an ingot is subjected to Secco etching for 30 minutes (Secco etching is an etching using a mixed solution of HF:K$_2$Cr$_2$O$_7$ (0.15 mol/l) 2:1). LSTD has a different index of refraction from that of silicon and becomes a source of generating scattered light when the interior of a silicon single crystal is irradiated with infrared rays.

Figure 24:
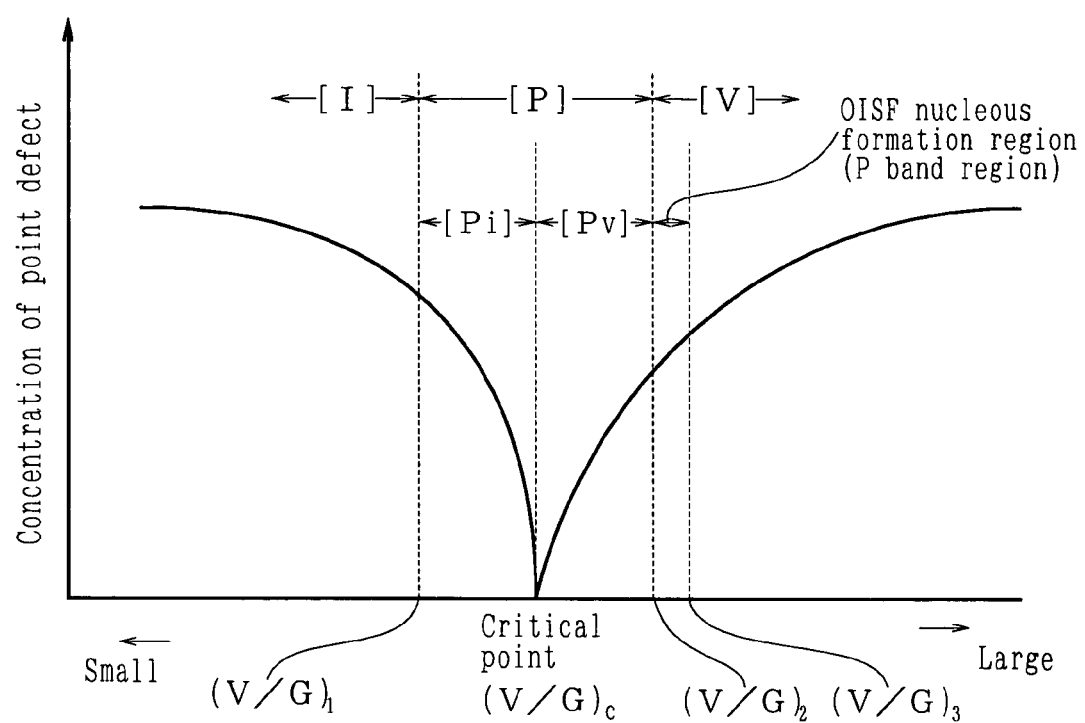
FIG. 24 is a graph showing the relationship between V/G and point defect concentration according to Voronkov's theory, in which the horizontal axis shows V/G and the vertical axis shows, on the same axis, the concentration of vacancy-type point defects and the concentration of interstitial silicon-type point defects.

According to Voronkov's theory, ratio V/G (mm$^2$/minute$\cdot$° C.), where the pull rate for an ingot is V (mm/minute) and the axial temperature gradient in the vicinity of the solid-liquid interface between a silicon melt and a silicon ingot is G (° C./mm), is controlled so as to grow a high purity ingot with a small number of defects. In this theory, the relationship between V/G and the concentration of point defects is graphically illustrated by showing V/G on the horizontal axis and showing the concentration of vacancy-type defects and the concentration of interstitial silicon-type defects on the same vertical axis, as depicted in FIG. 24, and thus, it is explained that the boundary between a vacancy region and an interstitial silicon region is determined by V/G. More specifically, when the V/G ratio is higher than the critical point (V/G)$_c$, the concentration of vacancies increases in the resulting ingot; in contrast, when the V/G ratio is lower than the critical point (V/G)$_c$, the concentration of interstitial silicons increases in the resulting ingot. In FIG. 24, [I] represents a region in which the interstitial silicons are predominant and the agglomerated defects of interstitial silicons are contained ((V/G)$_1$ or lower), [V] represents a region in which vacancies are predominant and the agglomerated defects of vacancies are contained ((V/G)$_2$ or higher), [P] is a perfect region in which neither the agglomerates of vacancy-type defects nor the agglomerates of interstitial silicon-type defects exist ((V/G)$_1$ to (V/G)$_2$)). In the boundary of the region [V] that is adjacent to the region [P], there exists a P band region ((V/G)$_2$ to (V/G)$_3$), in which OISF nuclei are formed. In the P band region, there exist micro plate-shaped precipitates and OISF (stacking fault) is formed by a heat treatment in an oxidizing atmosphere. Likewise, in the boundary of the region [I] that is adjacent to the region [P], there exists a B band region. In the B band region, micro dislocation clusters exist at a high density.

The perfect region [P] is further classified into a region [Pi] and a region [Pv]. The region [Pi] is a region in which the V/G ratio is from the above-mentioned (V/G)$_1$ to the critical point, and in which interstitial silicons are predominant and their agglomerated defects are not contained. The region [Pv] is a region in which the V/G ratio is from the critical point to the above-mentioned (V/G)$_2$, and in which vacancies are predominant and their agglomerated defects are not contained. In other words, [Pi] is a region that is adjacent to the region [I] and has a concentration of interstitial silicons less than the minimum concentration of interstitial silicons at which an interstitial-type large dislocation can be formed, and [Pv] is a region that is adjacent to the region [V] and has a concentration of vacancies less than the minimum concentration of vacancies defects at which an OISF nucleus can be formed.

The ingots that are the subject of the first to the fourth identification methods according to the present invention are pulled while controlling a V/G ratio to be within the range of (V/G)$_1$ to (V/G)$_2$.

The ingots that are the subject of the methods according to fifth to seventh identification method according to the present invention are pulled while controlling a V/G ratio so as to include each of the above-mentioned regions of from (V/G)$_1$ or lower to the critical point, and from the critical point to (V/G)$_3$ or above, in order to contain the region [V], the region [Pv], the region [Pi], and the region [I].

(2) First Identification Method According to the Present Invention

Figure 2:
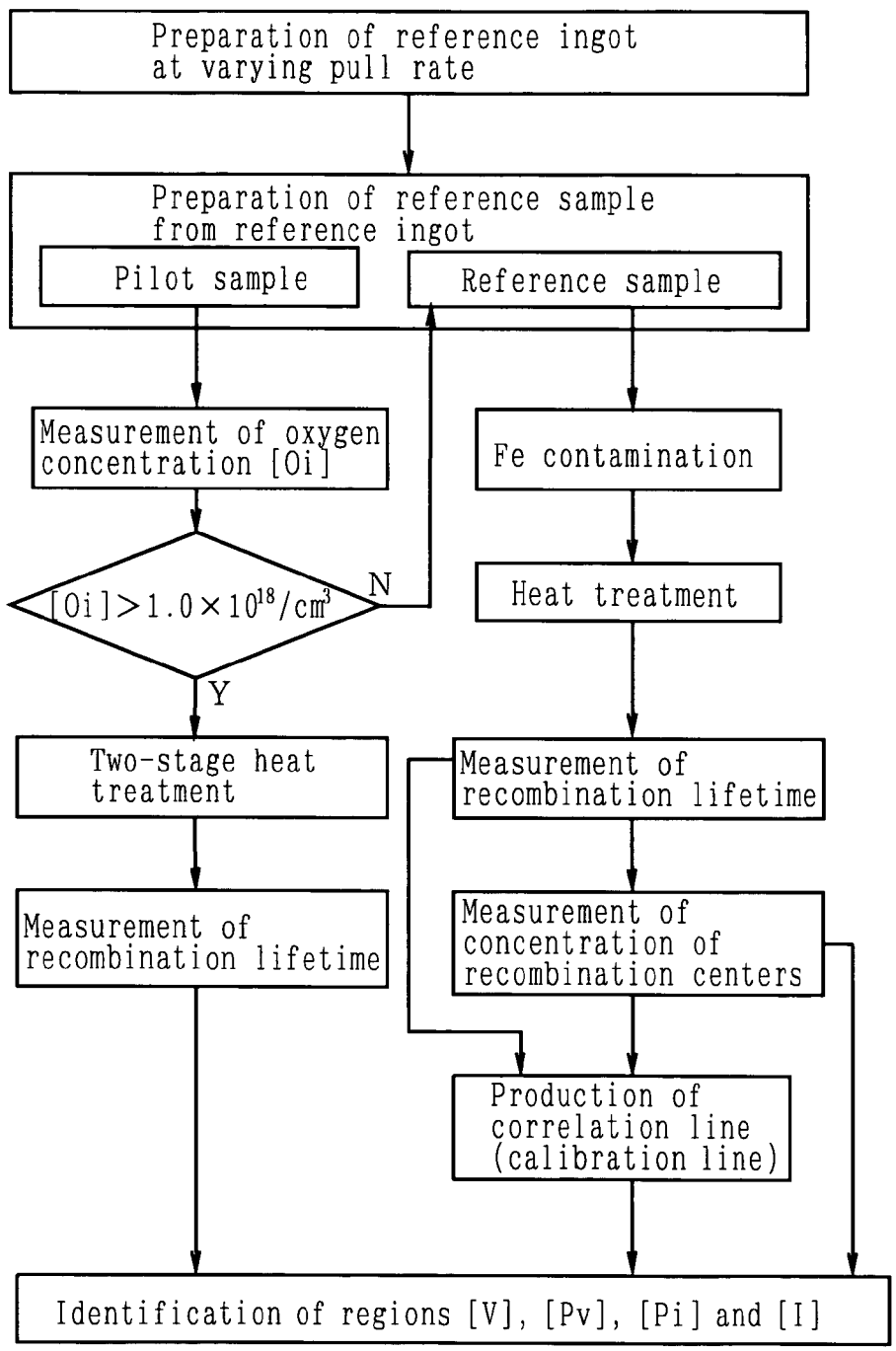
FIG. 2 a flowchart pertaining to a reference sample in the first identification method according to the present invention.
Figure 3:
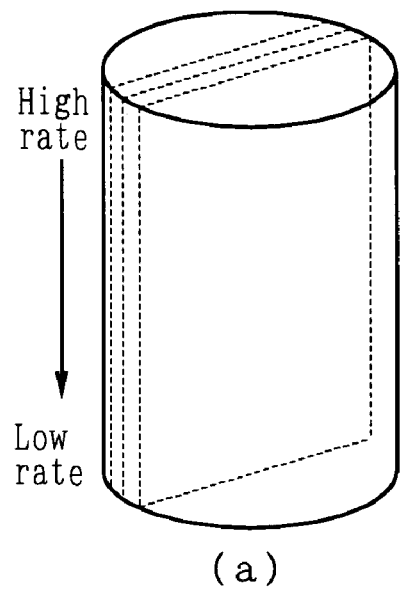
FIG. 3 illustrates how samples are prepared from an ingot.
Figure 3:
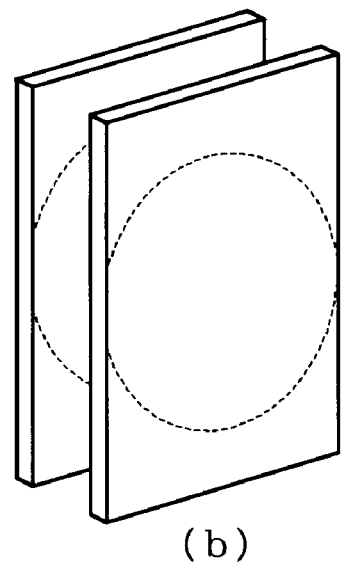
Figure 3:
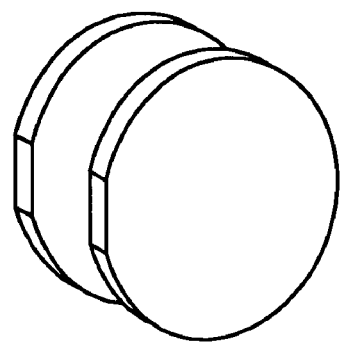

Next, with reference to FIGS. 1 to 3, a first identification method according to the present invention is described. First, as shown in FIGS. 2 and 3, a pilot sample and a reference sample are prepared from an ingot. Specifically, a first ingot is pulled from a first silicon melt stored in a quartz crucible of pulling equipment according to a CZ method or an MCZ method. In this pulling of the ingot, pull rate V (mm/minute) is varied from a high rate (top side) to a low rate (bottom side) so that the ingot contains the region [V], the region [Pv], the region [Pi], and the region [I] along the axial direction. The obtained first ingot is sliced in the axial direction and subjected to a mirror etching to prepare a pilot sample and a reference sample in wafer shape having a thickness of 500 to 1000 μm and a mirror-finished surface.

Figure 4:
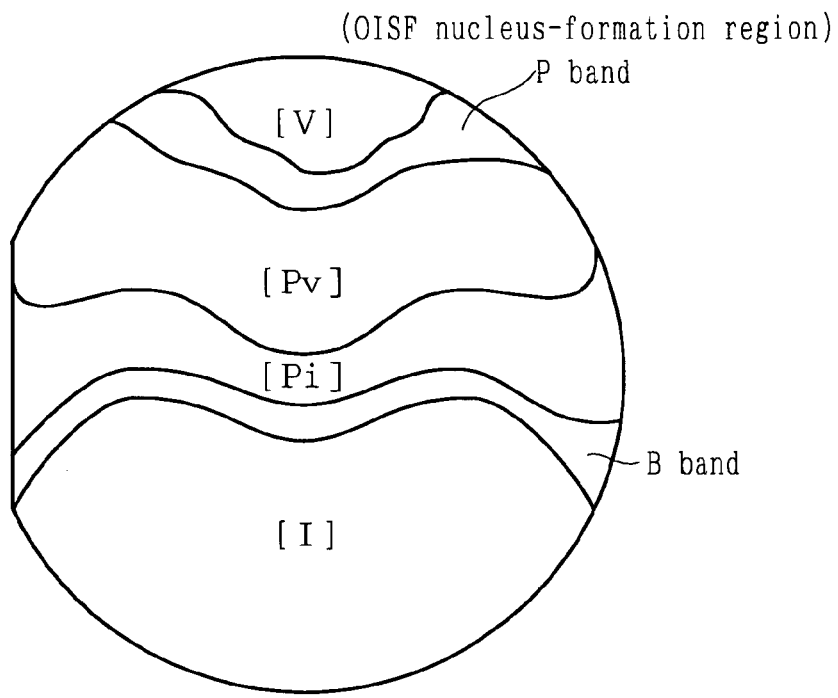
FIG. 4 is a figure showing recombination lifetime in an entire sample measured by an LM-PCD method after a pilot sample having a high oxygen concentration is subjected to a two-stage heat treatment, according to the first identification method.

The concentration of oxygen dissolved in the pilot sample is measured using an FT-IR (Fourier transform infrared absorption spectroscopy) method. When the oxygen concentration is $1.0 \times 10^{18}$ atoms/cm$^3$ or higher, the pilot sample is heat-treated at 800° C. for 4 hours in a nitrogen atmosphere, and subsequently further heat-treated at 1000° C. for 16 hours. The recombination lifetime of the heat-treated sample is measured over the entire sample using an LM-PCD method. FIG. 4 shows an example of the result of the measurement. As shown in FIG. 4, oxygen precipitates appear in the sample at a high density as a result of the above-described two-stage heat treatment. According to the distribution of their concentrations, the region [V], the region [Pv], the region [Pi], and the region [I] are clearly identified in the entire sample. In the region [V], there exists a P band region in which OISF nuclei are formed, and in the region [I], there exists a B band region.

Figure 5:
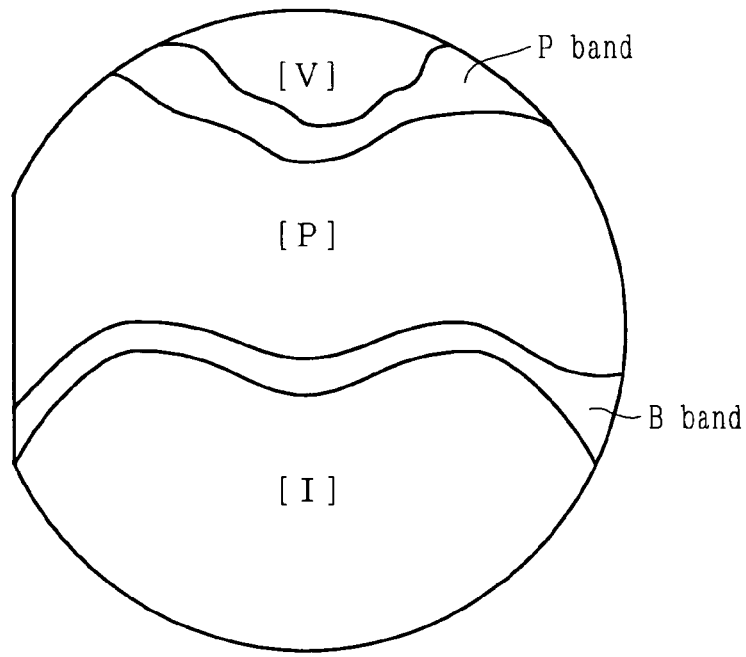
FIG. 5 is a figure showing recombination lifetime in an entire sample measured by an LM-PCD method after a measurement sample having a low oxygen concentration is subjected to Fe contamination and heat treatment, according to the first identification method.

On the other hand, when the oxygen concentration is less than $1.0 \times 10^{18}$ atoms/cm$^3$ in the pilot sample, it is impossible to identify, as seen from FIG. 5, whether a perfect region [P] is a region [Pv] or a region [Pi] based on the result of the recombination lifetime measurement in the same manner as described above in which the sample is heat-treated and the recombination lifetime is measured. In view of this, in the present invention, the reference sample is metal-contaminated by coating the sample with a transition metal solution, as shown in FIG. 2. Examples of the transition metal include Fe, Ni, Cu, or Co. The transition metal solution is a solution in which the transition metal is dissolved at a concentration of 1 to 1000 ppm, preferably, 1 to 100 ppm. Especially preferred is a standard solution for atomic absorption spectroscopy in which Fe, Ni, Cu, or Co is dissolved at a concentration of 10 to 100 ppm. Examples of the coating method include a spin coating method and a dipping method. When the concentration of the transition metal solution is less than the lower limit value, the subsequent measurement of recombination lifetime cannot be made with high precision. On the other hand, when the concentration exceeds the upper limit value, the transition metal diffuses over the front and back surfaces of the sample, forming metal silicide (precipitate) in the vicinity of the front and back surfaces; as a result, it is impossible to form a recombination center, which is a deep energy level, inside the sample (in the crystal).

In the first identification method, as shown in FIG. 2, the reference sample is Fe-contaminated by coating a surface thereof with a solution in which Fe is dissolved at a concentration of 1 ppm by a spin coating method. The Fe-contaminated reference sample is heat-treated in an atmosphere of argon, nitrogen, oxygen, hydrogen, or a mixed gas thereof. For this heat treatment, there are two possible methods; one is a method in which the heat treatment is carried out at temperatures of 600 to 1200° C. for 0.5 to 24 hours while increasing the temperature at a rate of 0.5 to 10° C./minite, and the other is a method in which the heat treatment is carried out at temperatures of 600 to 1100° C. for 10 to 60 seconds while increasing the temperature at a rate of 30 to 70° C./second (RTA method). For the former method, it is preferable to carry out the heat treatment at 900 to 1000° C. for 1 to 2 hours while increasing the temperature at a rate of 5 to 10° C./minute. For the latter method, (RTA method), it is preferable to carry out the heat treatment at 900 to 1000° C. for 30 to 60 seconds while increasing the temperature at a rate of 30 to 50° C./second. When the duration and the temperature of the heat treatment is less than the lower limit values, the transition metal does not diffuse in the sample sufficiently. On the other hand, when they exceed the upper limit values, the transition metal diffuses over the front and back surfaces of the sample, forming metal silicide (precipitate) in the vicinity of the front and back surfaces, and therefore, it is impossible to form a recombination center, which is a deep energy level, in the sample (in the crystal).

The reference sample that has undergone the heat treatment is subjected to the following two measurements. Specifically, they include (A) a measurement of the concentration of recombination centers in the entire sample that are formed by the transition metal, and (B) a measurement of recombination lifetimes associated with the transition metal. For the method of the above (A), a DLTS (Deep Level Transient Spectroscopy) method is preferable, whereas for the method of the above (B), an LM-PCD (Laser/Microwave Photoconductivity Decay) method is preferable. The DLTS method quantifies the concentration of recombination centers formed by the transition metal in the sample. The LM-PCD method quantifies the recombination lifetimes over the entire sample.

Figure 6:
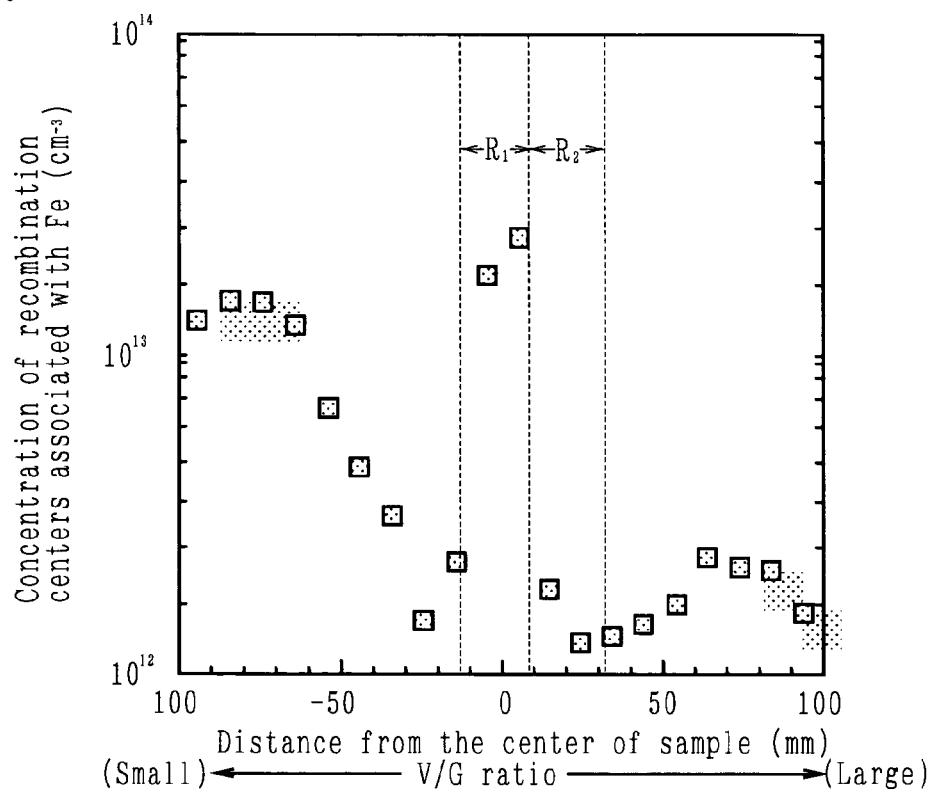
FIG. 6 is a graph showing the concentration of recombination centers associated with Fe in a reference sample having a low oxygen concentration when the sample is measured using a DLTS method, in accordance with the first identification method.
Figure 7:
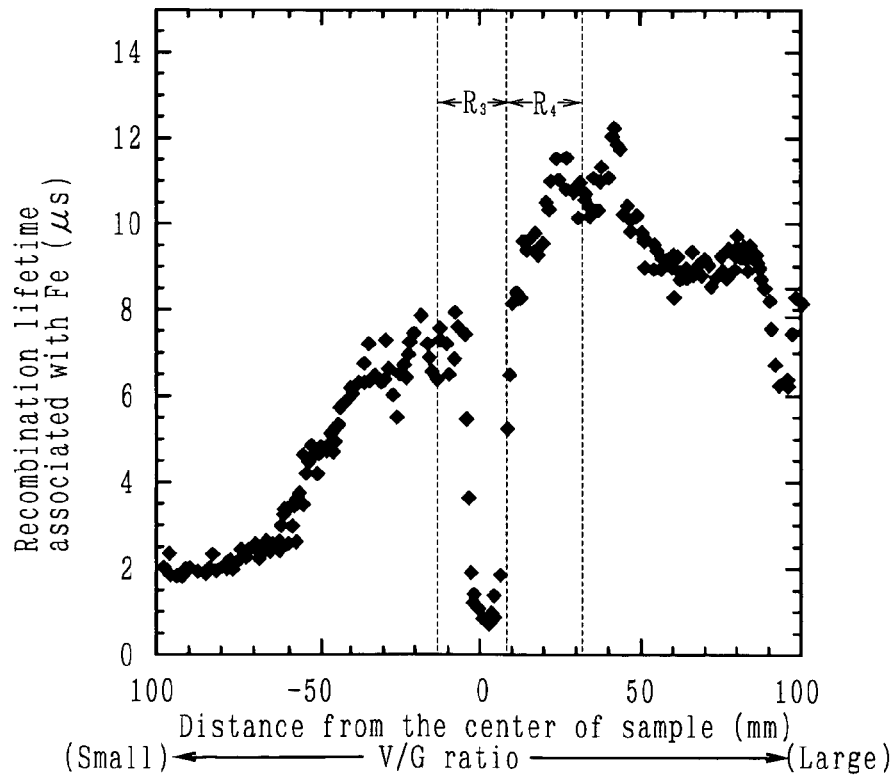
FIG. 7 is a graph showing the recombination lifetime associated with Fe in the entire reference sample having a low oxygen concentration when the sample is measured by an LM-PCD method, in accordance with the first identification method.
Figure 8:
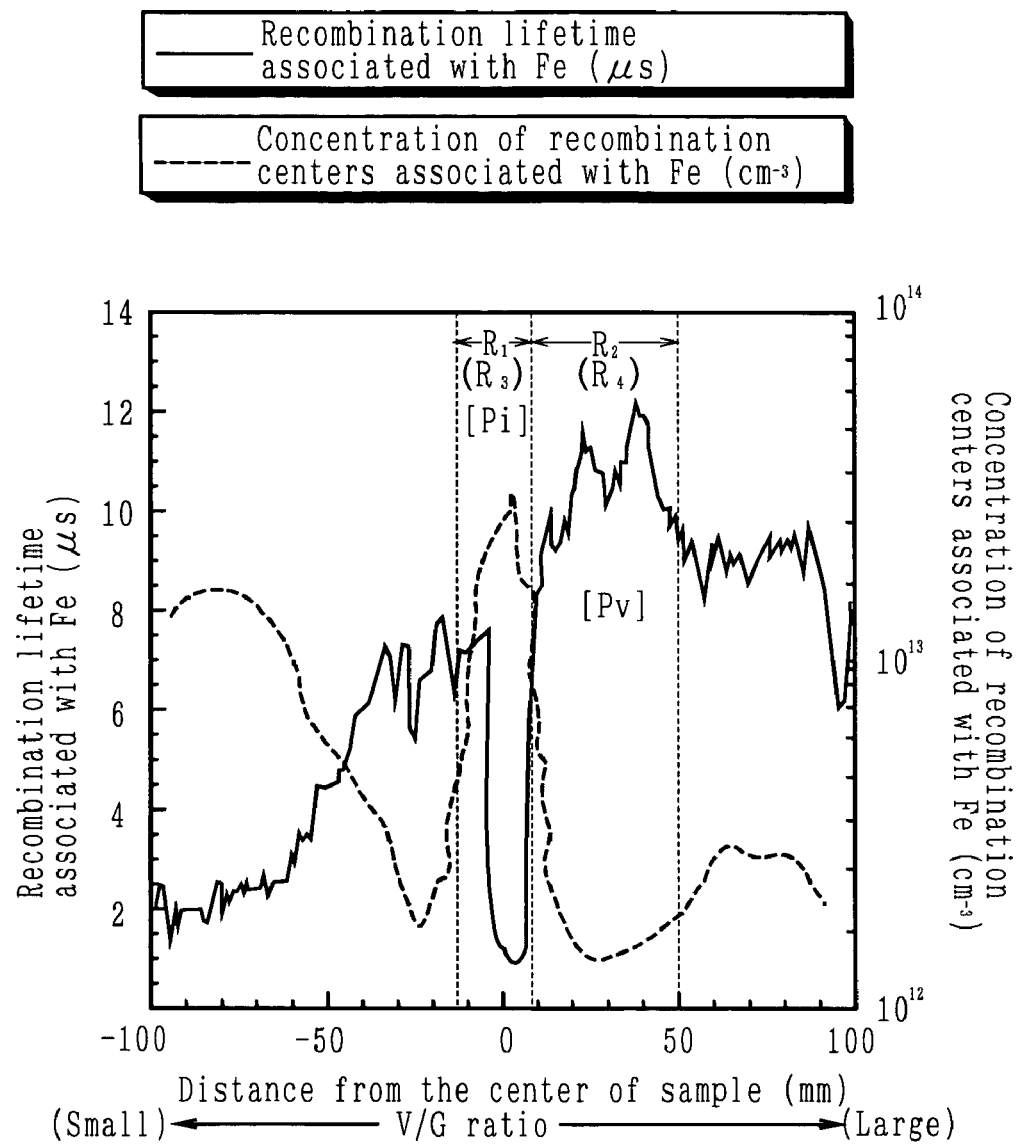

FIG. 6 shows the result of the measurement of the concentration of recombination centers obtained by the above (A). FIG. 7 shows the result of the measurement of recombination lifetimes obtained by the above (B). In FIGS. 6 and 7, their horizontal axes correspond to the axial direction of the ingot from which the samples are not yet sliced. The V/G ratio is large at the right end of the horizontal axis in both figures, and the V/G ratio is small at the left end thereof. From FIG. 6, it is understood that while varying the V/G ratio, Fe concentration is the highest in a central region $R_1$ of the sample, and that Fe concentration is the lowest in a region $R_2$ that is on the right of the region R1. Likewise, from FIG. 7, it is understood that deterioration of the recombination lifetime is very severe in a central region $R_3$ of the sample, and that the recombination lifetime is the highest in a region $R_4$ that is on the right of the region $R_3$. FIG. 8 shows a graph in which FIG. 6 and FIG. 7 are combined. From FIG. 8, it is understood that the region $R_1$ is in agreement with $R_3$, and the region $R_2$ is in agreement with $R_4$. From the result of FIG. 4 and Voronkov's theory, it is concluded that the region $R_1$ ($R_3$) is a region [Pi] in which oxygen precipitation is suppressed most, and it is concluded that the region $R_2$ ($R_4$) is a region [Pv] in which oxygen precipitation is promoted most.

The reason that the region exhibiting the highest Fe concentration is the region [Pi] and the region exhibiting the lowest Fe concentration is the region [Pv] is as follows. When a solution of Fe, which is a transition metal, is coated on a sample surface and Fe is diffused in the sample by a heat treatment, Fe is captured by vacancies, and when the sample is cooled, oxygen precipitates including Fe are formed in the region [V] and the region [Pv] within the sample. Since the content of Fe in the oxygen precipitates is attributed to the amount of vacancy-type point defects, the content of Fe in the region [Pv] is less than that in the region [V]. On the other hand, since the region [Pi] contains neither vacancies that capture transition metal nor agglomerated interstitial silicon-type point defects, Fe stays in the bulk of silicon. In the region [I], Fe reacts with agglomerated interstitial silicon-type point defects, forming Fe silicide. The above-described behavior of Fe in each of the regions is consistent and does not depend on whether the concentration of oxygen is high or low. By thus measuring the concentration of recombination centers formed by Fe groups in the entire sample, it is possible to define the region [Pv] and the region [Pi] as well as the boundary thereof in the sample.

Figure 9:
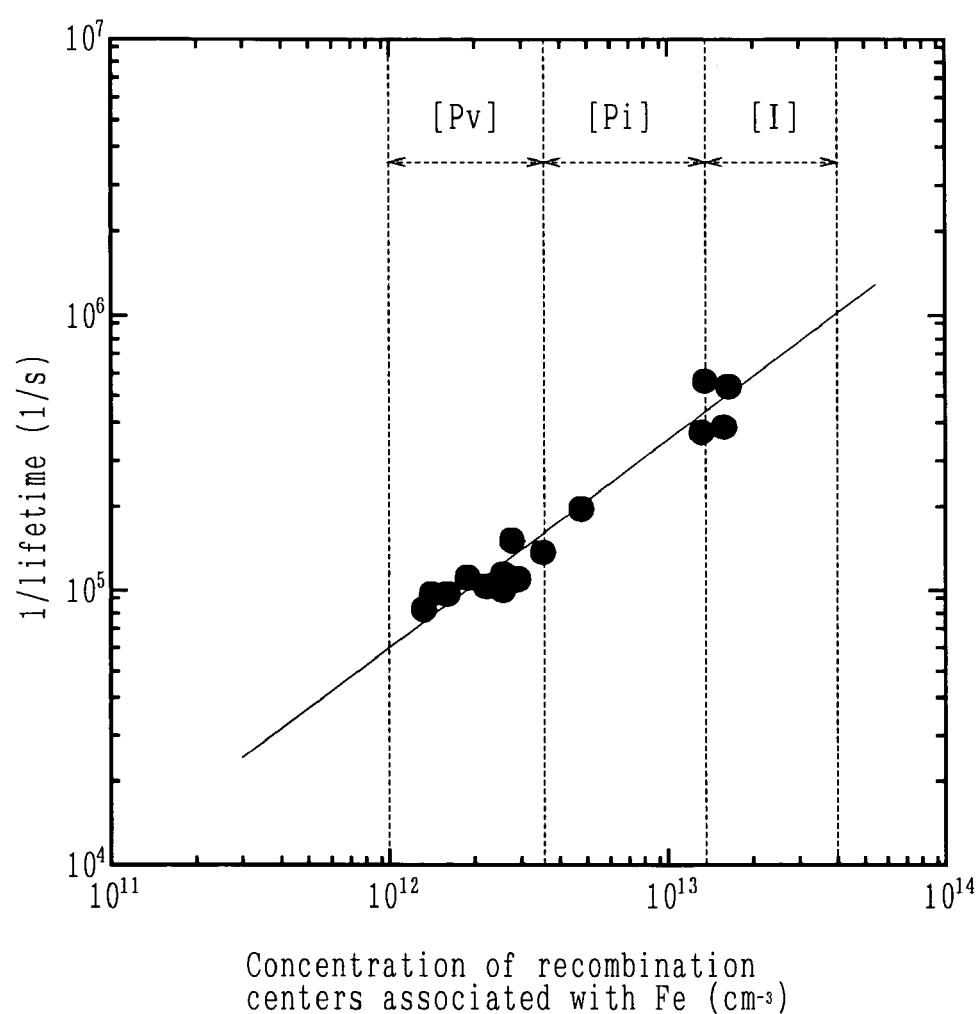
FIG. 9 is a graph showing a calibration line obtained by plotting the measurement values obtained by the DLTS method and the reciprocals of the measurement values obtained by the LM-PCD method for the reference sample having a low oxygen concentration, in accordance with the first identification method.

Meanwhile, it is inferred from FIG. 8 that the recombination lifetime and the concentration of recombination centers correlate with each other, and FIG. 9 is obtained by plotting the measurement values of the above (A) and reciprocals of the measurement values of the above (B). It is understood from FIG. 9 that the two lines are in a linear correlation, and a calibration line is produced from this linear line of correlation. This linear line is represented by the following Equation (1):

$$Fe=(1\times10^{13}/\text{lifetime}) \text{ (cm}^{-3}\cdot\mu s) \tag{1}$$

FIG. 9 also shows the region [Pv], the region [Pi], and the region [I].

Next, as shown in FIG. 1, a pilot sample and a measurement sample are prepared from a measurement ingot. Specifically, a second ingot is pulled from a second silicon melt stored in a quartz crucible of pulling equipment according to a CZ method or an MCZ method. In the pulling of the second ingot, for example, a V/G value is controlled to be within the range of $(V/G)_1$ to $(V/G)_2$ shown in FIG. 24 so that the second ingot contains the perfect region [P] over the entire length. The obtained second ingot is sliced in the axial direction and subjected to a mirror etching to prepare a pilot sample and a measurement sample in wafer shape having a thickness within the range of 0.5 to 1 mm and a mirror-finished surface.

The concentration of the oxygen dissolved in the pilot sample is measured using an FT-IR method, and when the oxygen concentration is $1.0\times10^{18}$ atoms/cm$^3$ or higher, the same two-stage heat treatment as the above-described two-stage heat treatment for the reference sample is carried out. The recombination lifetime of the heat-treated sample is measured over the entire sample using the LM-PCD method. In a pilot sample having a high oxygen concentration, oxygen precipitates appear in the sample at a high density due to the two-stage heat treatment, and therefore, the region [Pv] and the region [Pi] as well as the boundary thereof are clearly identified in the sample.

On the other hand, when the oxygen concentration of the pilot sample is less than $1.0\times10^{18}$ atoms/cm$^3$, the measurement sample shown in FIG. 1 is coated with the transition metal solution to metal-contaminate this sample in a similar manner to the metal contamination for the reference sample. In the first identification method, as shown in FIG. 1, the measurement sample is Fe-contaminated by coating a surface thereof with a solution in which Fe is dissolved at a concentration of 1 ppm. The Fe-contaminated measurement sample is subjected to a similar heat treatment to that for the above-described reference sample. The recombination lifetime associated with Fe is measured regarding the heat-treated measurement sample. By applying a measurement value of the recombination lifetime to the calibration line shown in FIG. 9 and accordingly obtaining the concentration of recombination centers, it is possible to infer whether a region in the measurement sample is the region [Pv] or the region [Pi], from the obtained value of the concentration of recombination centers.

(3) Second Identification Method According to the Present Invention

Figure 10:
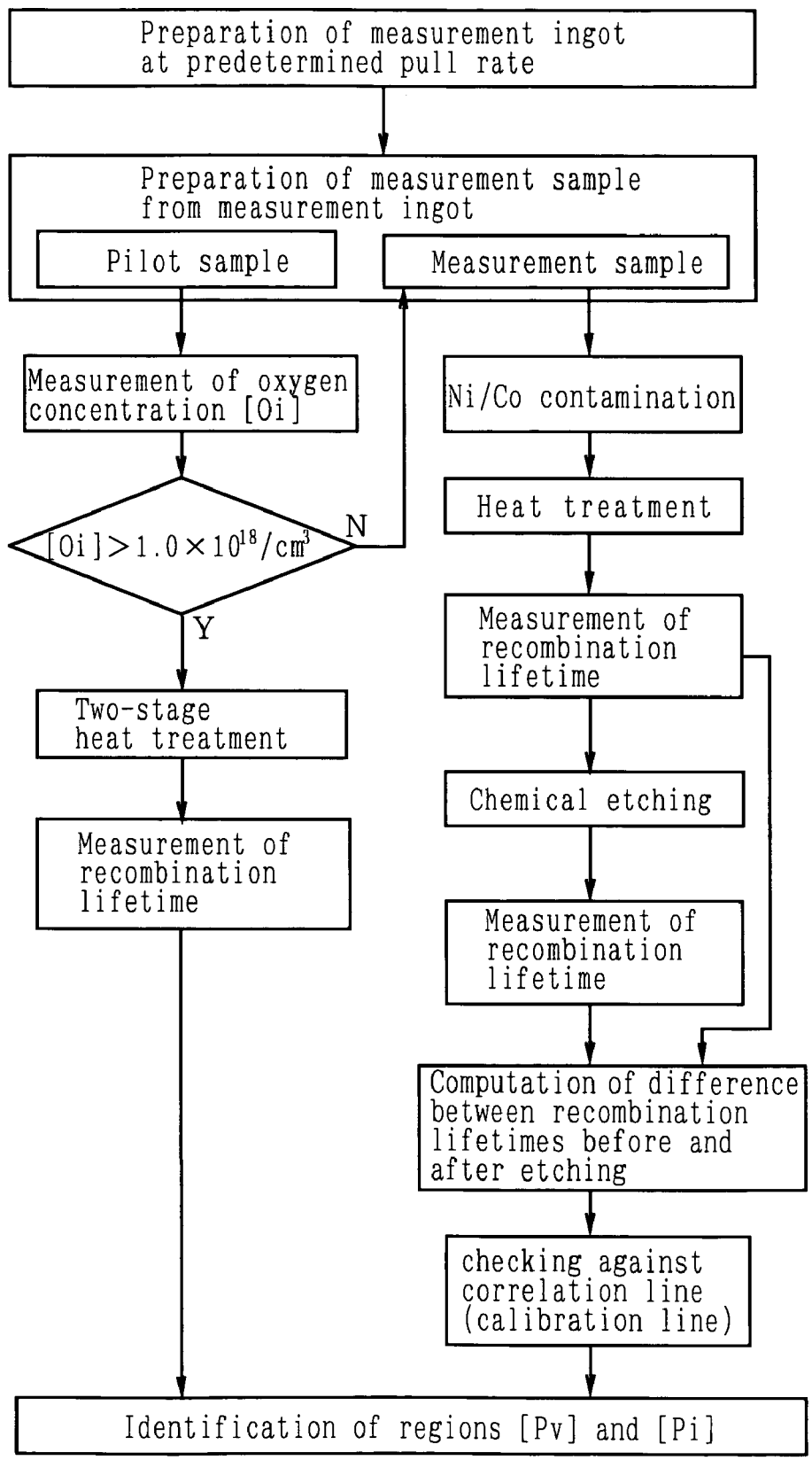
FIG. 10 is a flowchart pertaining to a measurement sample in a second identification method according to the present invention.
Figure 11:
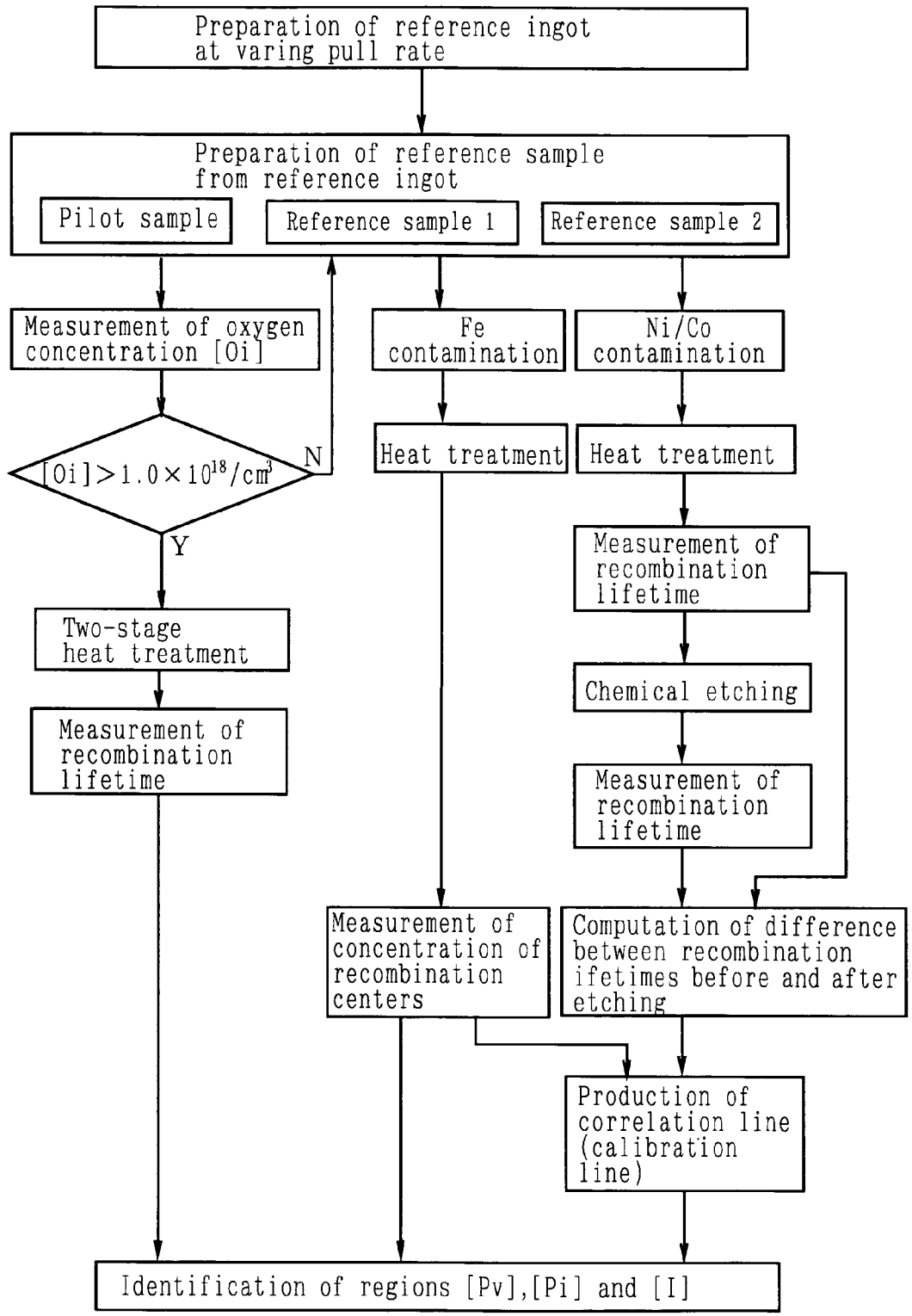
FIG. 11 is a flowchart pertaining to reference samples in the second identification method according to the present invention.

A second identification method is as shown in FIGS. 10 and 11. As shown in FIG. 11, when the oxygen concentration of the pilot sample is less than $1.0\times10^{18}$ atoms/cm$^3$, two reference samples are sliced from the ingot. A first reference sample is coated with a solution in which Fe is dissolved to Fe-contaminate the sample, while a second reference sample is coated with a solution in which Ni or Co is dissolved to Ni- or Co-contaminate the sample. These reference samples are separately or simultaneously heat-treated. The conditions in the heat treatment are the same as those in the first identification method.

Regarding the first reference sample, which has been Fe-contaminated and thereafter heat-treated, the concentration of recombination centers associated with Fe is measured in a similar manner to that in the first identification method. Thereby, the region [V], the region [Pv], the region [Pi], and the region [I] can be identified in the first reference sample having a low oxygen concentration. Meanwhile, the recombination lifetime is measured regarding the second reference sample that has been Ni- or Co-contaminated and thereafter heat-treated, in a similar manner to that in the first identification method. Subsequently, the second reference sample is etched using an etchant solution including NH$_3$, HF, and CH$_3$COOH. Ni or Co has a greater diffusion coefficient than Fe and therefore precipitates in the vicinity of the sample surface due to the heat treatment, but by this etching, Ni or Co present in the vicinity of the surface is removed. Under this condition, the recombination lifetime in the second reference sample is measured again in a similar manner to that in the first identification method. Then, the difference between the recombination lifetimes in the entire sample before and after the chemical etching is computed. As shown in FIG. 11, it is understood that after the chemical etching, the region [Pi] and the region [I] show remarkable increases in their recombination lifetimes, whereas the region [V] does not show a change in the recombination lifetime before and after the chemical etching. For this reason, it is also possible to identify the region [V], the region [Pv], the region [Pi], and the region [I] with the use of Ni diffusion from the amount of recombination lifetime increased before and after the chemical etching.

In a similar manner to that in the first identification method, a calibration line (not shown) is produced from the correlation between the measurement values of the concentrations of recombination centers associated with Fe in the first reference sample and the measurement values of the recombination lifetimes in the second reference sample.

Next, as shown in FIG. 10, a pilot sample and a measurement sample are prepared from a measurement ingot in a similar manner to that in first identification method. This ingot is pulled while controlling a V/G value so as to be within the range of $(V/G)_1$ to $(V/G)_2$ shown in FIG. 24 so that it contains the perfect region [P] over the entire length. When the oxygen concentration of this pilot sample is less than $1.0\times10^{18}$ atoms/cm$^3$, as in the second reference sample, the measurement sample is coated with a Ni or Co solution to Ni- or Co-contaminate this sample. This Ni- or Co-contaminated measurement sample is heat-treated similarly to the foregoing second reference sample. As shown in FIG. 10, the heat-treated measurement sample is subjected to a measurement of recombination lifetimes associated with Ni or Co. After chemically etching the measurement sample similarly to the second reference sample, the recombination lifetimes are measured again regarding the measurement sample. Subsequently, the difference between the recombination lifetimes in the entire sample before and after the chemical etching is computed. By applying a measurement value of the recombination lifetime to the calibration line, which is not shown in the figure, it is possible to infer whether a region in the measurement sample is the region [Pv] or the region [Pi].

(4) Third Identification Method According to the Present Invention

Figure 12:
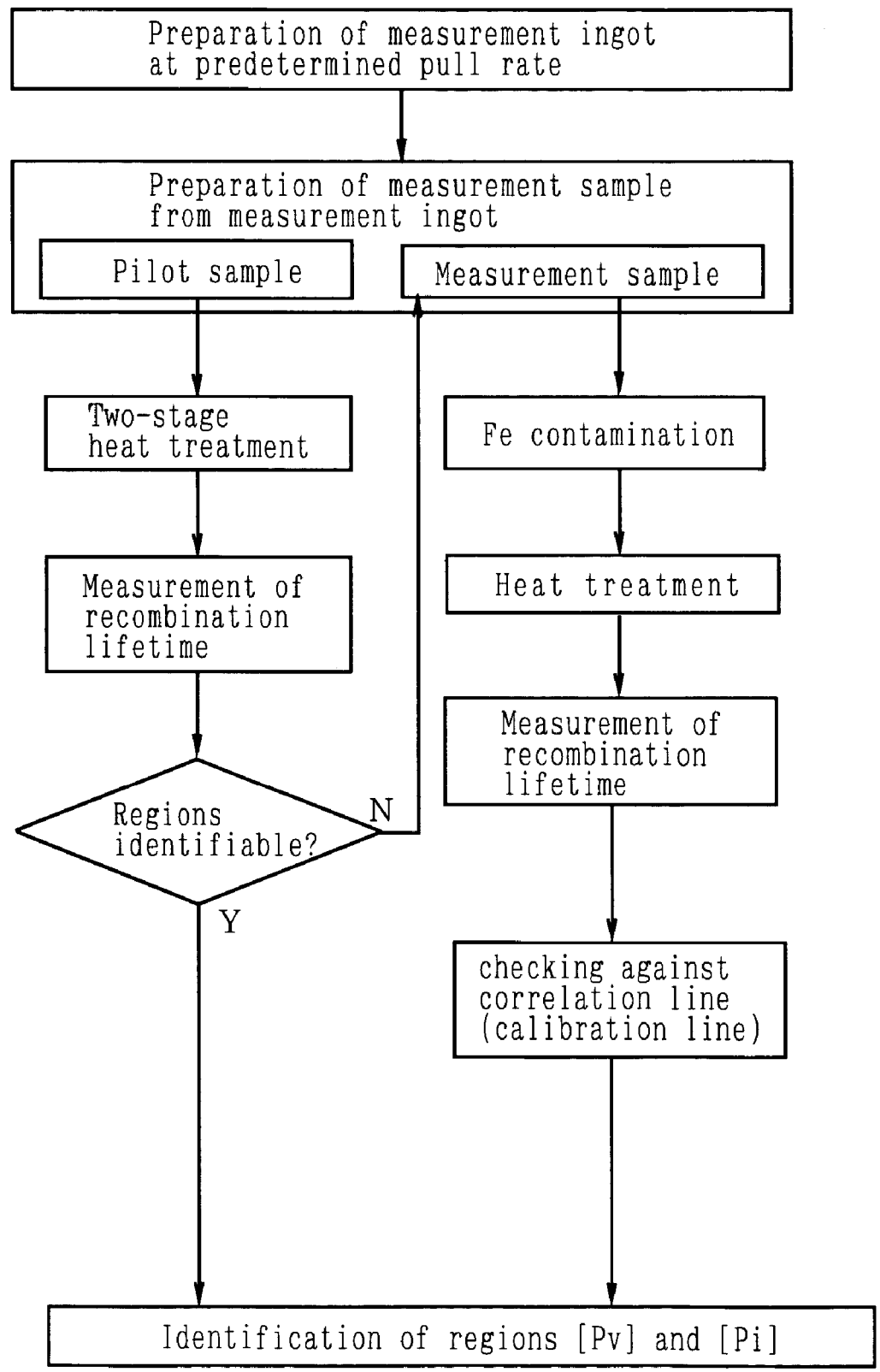
FIG. 12 is a flowchart pertaining to a measurement sample in a third identification method according to the present invention.
Figure 13:
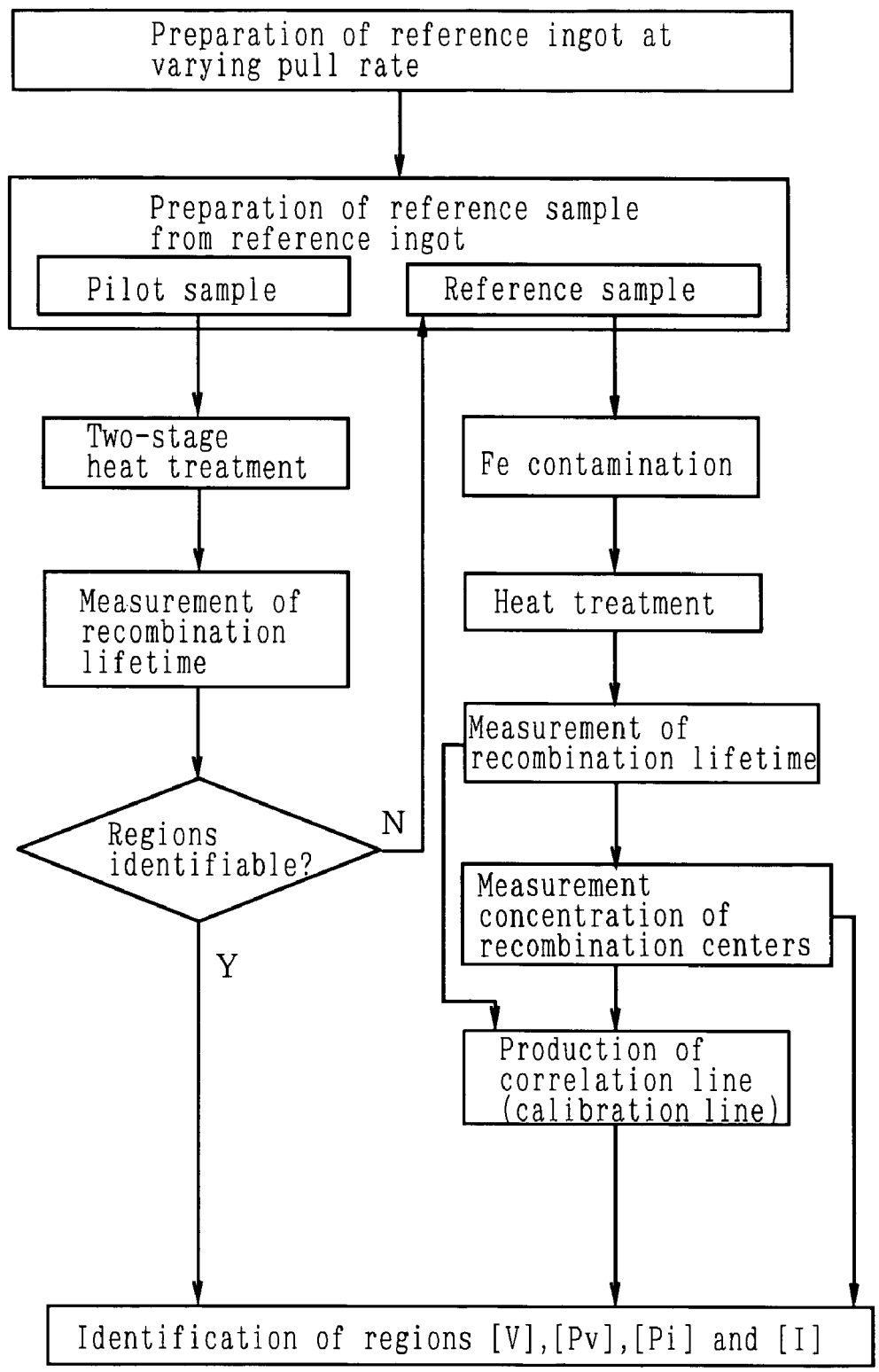
FIG. 13 is a flowchart pertaining to a reference sample in the third identification method according to the present invention.

A third identification method is as shown in FIGS. 12 and 13. As shown in FIG. 13, a pilot sample is first subjected to the same two-stage heat treatment as that in the first identification method, and the recombination lifetime is measured. When the boundaries of the region [V], the region [Pv], the region [Pi], and the region [I] cannot be identified in the pilot sample as a result of this, a reference sample sliced from the ingot is coated with a solution in which Fe is dissolved to Fe-contaminate the sample. This reference sample is heat-treated similarly to the first identification method. The concentration of recombination centers associated with Fe is measured in the heat-treated reference sample similarly to the first identification method, it is possible to identify the region [V], the region [Pv], the region [Pi], and the region [I] in the reference sample. Meanwhile, the recombination lifetime of the reference sample that has been Fe-contaminated and thereafter heat-treated is measured similarly to the first identification method. From the correlation between the measurement values of the concentration of recombination centers associated with Fe and the measurement values of the recombination lifetime in the reference sample, a calibration line, although not shown in the figure, is produced similarly to that in the first identification method.

Next, as shown in FIG. 12, a pilot sample and a measurement sample are prepared from a measurement ingot, similarly to those in the first identification method. This ingot is pulled while controlling a V/G value to be within the range of $(V/G)_1$ to $(V/G)_2$ shown in FIG. 24 such that it contains a perfect region [P] over the entire length. This pilot sample is subjected to the same two-stage heat treatment as that in the first identification method, and the recombination lifetime is measured. When the region [Pv] and the region [Pi] as well as the boundary thereof cannot be identified in the pilot sample as a result of this, the measurement sample is coated with a solution in which Fe is dissolved to Fe-contaminate the sample. After this measurement sample is heat-treated similarly to that in first identification method, the recombination lifetime associated with Fe is measured in the measurement sample. By applying a measurement value of the recombination lifetime to the calibration line, which is not shown in the figure, and accordingly obtaining the concentration of recombination centers, it is possible to infer whether a region in the measurement sample is the region [Pv] or the region [Pi] from the obtained value of the concentration of recombination centers.

(5) Fourth Identification Method According to the Present Invention

Figure 14:
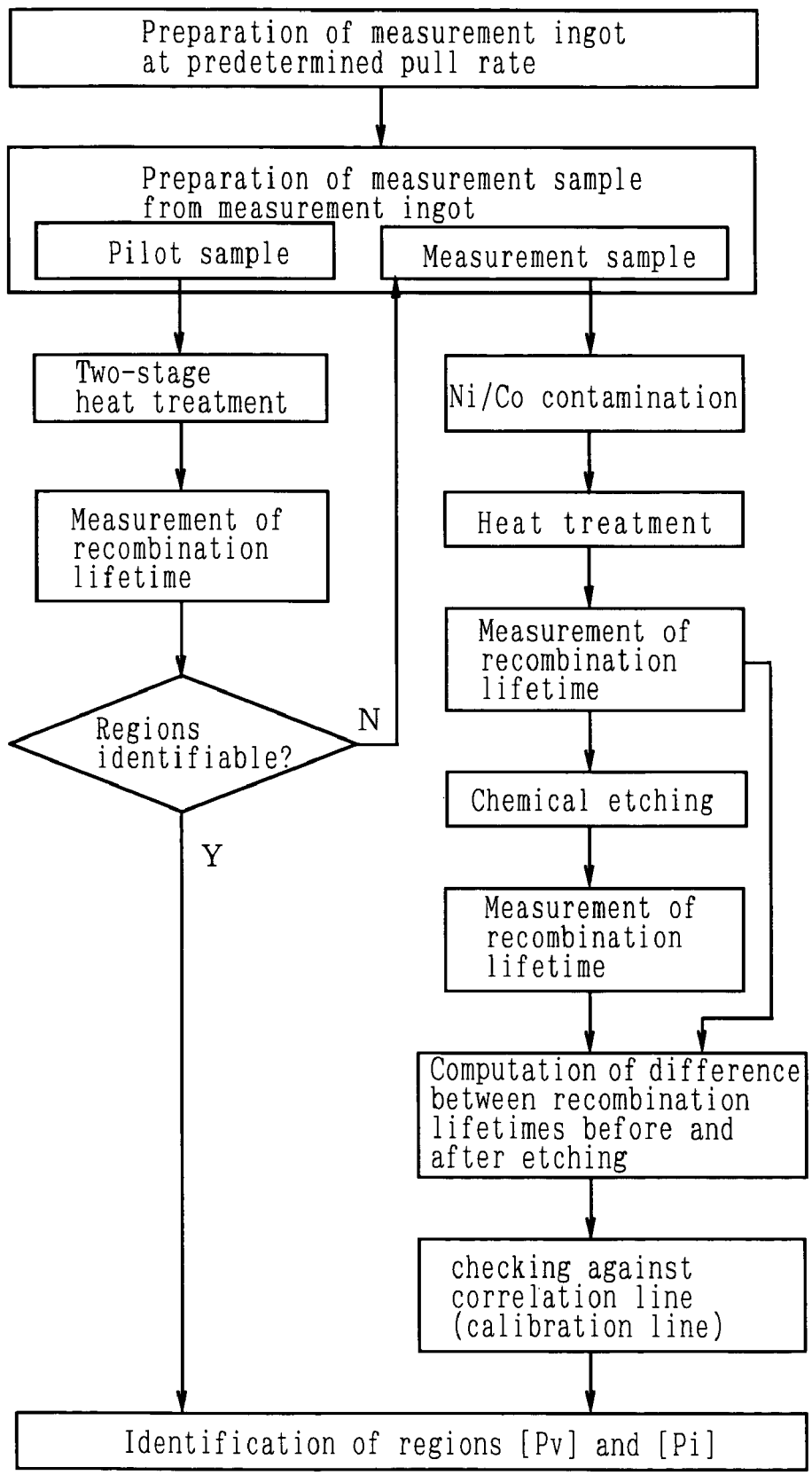
FIG. 14 is a flowchart pertaining to a measurement sample in a fourth identification method according to the present invention.
Figure 15:
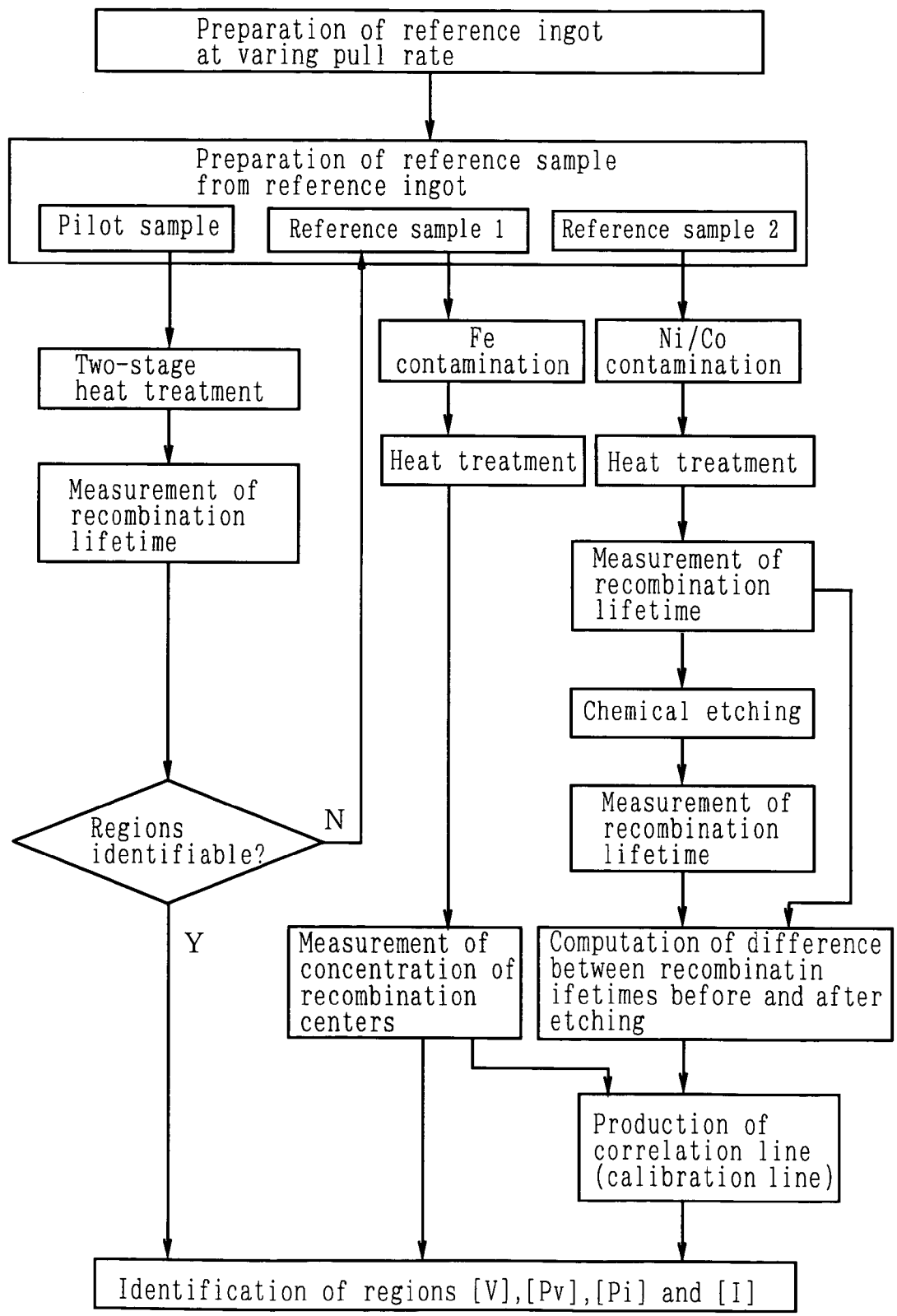
FIG. 15 is a flowchart pertaining to reference samples in the fourth identification method according to the present invention.

A fourth identification method is shown in FIGS. 14 and 15. As shown in FIG. 15, a pilot sample is first subjected to the same two-stage heat treatment as that in the first identification method, and the recombination lifetime is measured. When the boundaries of the region [V], the region [Pv], the region [Pi], and the region [I] cannot be identified in the pilot sample as a result of this, two reference samples are sliced from an ingot, and a first reference sample is coated with a solution in which Fe is dissolved to Fe-contaminate the sample, whereas a second reference sample is coated with a solution in which Ni or Co is dissolved to Ni- or Co-contaminate the sample. These reference samples are separately or simultaneously heat-treated. The conditions of the heat treatment are the same as those in the first identification method.

For the first reference sample that has been Fe-contaminated and thereafter heat-treated, the concentration of recombination centers associated with Fe is measured in a similar manner to that in the first identification method. Thereby, the region [V], the region [Pv], the region [Pi], and the region [I] can be identified in the first reference sample. Meanwhile, the second reference sample that has been Ni- or Co-contaminated and thereafter heat-treated is chemically etched in a similar manner to that in the second identification method, and thereafter, the recombination lifetime of the second reference sample is measured again. Subsequently, the difference between the recombination lifetimes in the entire sample before and after the chemical etching is computed. From the correlation between the measurement values of the concentration of recombination centers associated with Fe in the first reference sample and the measurement values of the recombination lifetimes in the second reference sample, a calibration line, although not shown in the figure, is produced similarly to that in the first identification method.

Next, as shown in FIG. 14, a pilot sample and a measurement sample prepared from a measurement ingot in a similar manner to that in the first identification method. This ingot is pulled while controlling a V/G value so as to be within the range of $(V/G)_1$ to $(V/G)_2$ shown in FIG. 24 such that a perfect region [P] is contained over the entire length. This pilot sample subjected to the same two-stage heat treatment as that in the first identification method, and the recombination lifetime is measured. When the region [Pv] and the region [Pi] as well as the boundary thereof cannot be identified in the pilot sample as a result of this, the measurement sample is coated with a Ni or Co solution to Ni- or Co-contaminate this sample as in the case of the second reference sample. This Ni- or Co-contaminated measurement sample is heat-treated as in a similar manner to the second reference sample. The recombination lifetime associated with Ni or Co is measured in the heat-treated measurement sample. This measurement sample is also chemically etched as is the second reference sample, and the recombination lifetime of the measurement sample is measured again. Subsequently, the difference between the recombination lifetimes in the entire sample before and after the chemical etching is computed. By applying a measurement value of the recombination lifetime to the calibration line, although not shown in the figure, it is possible to infer whether a region in the measurement sample is the region [Pv] or the region [Pi].

(6) Fifth Identification Method According to the Present Invention

Figure 16:
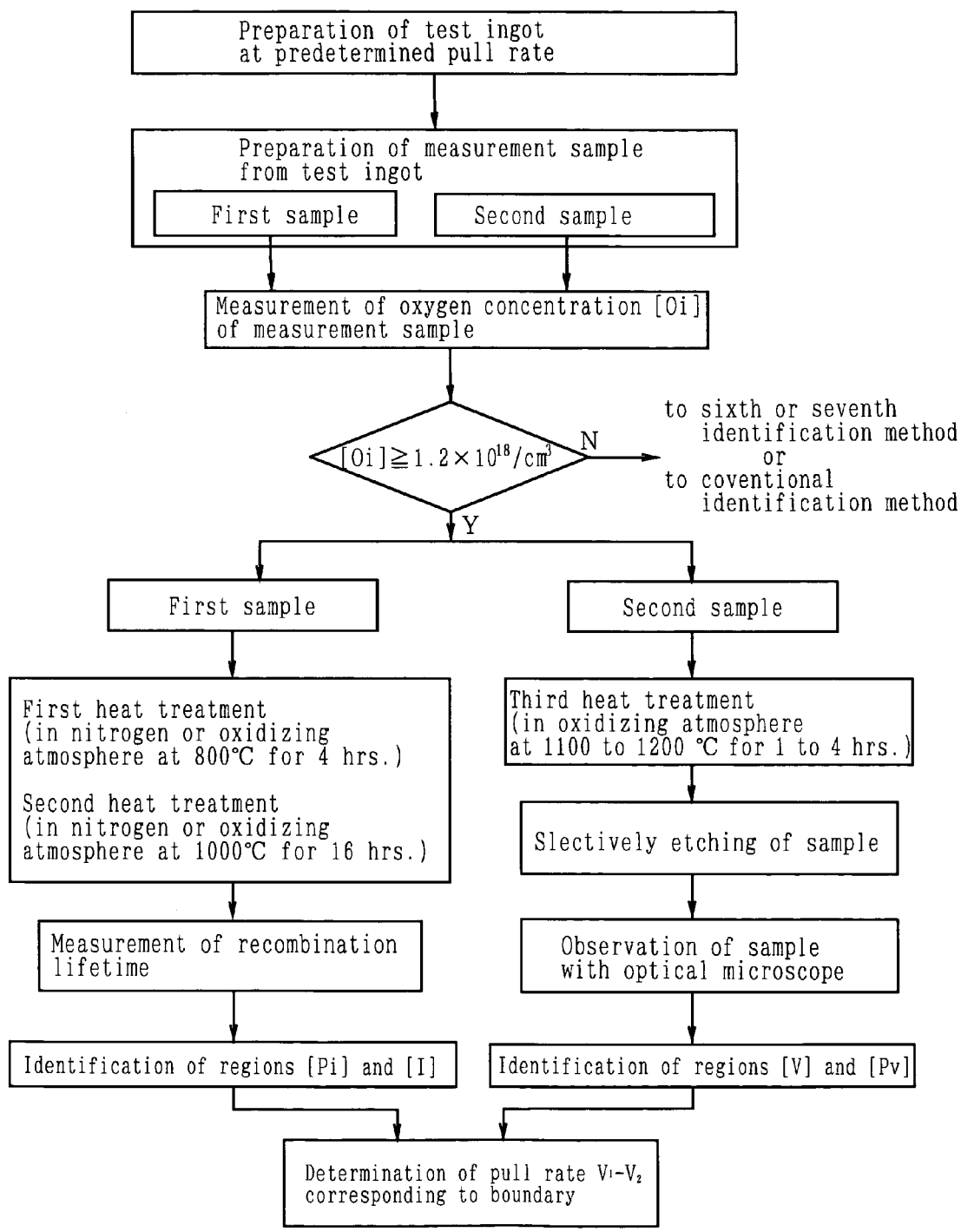
FIG. 16 is a flowchart pertaining to measurement samples in a fifth identification method according to the present invention.
Figure 19:
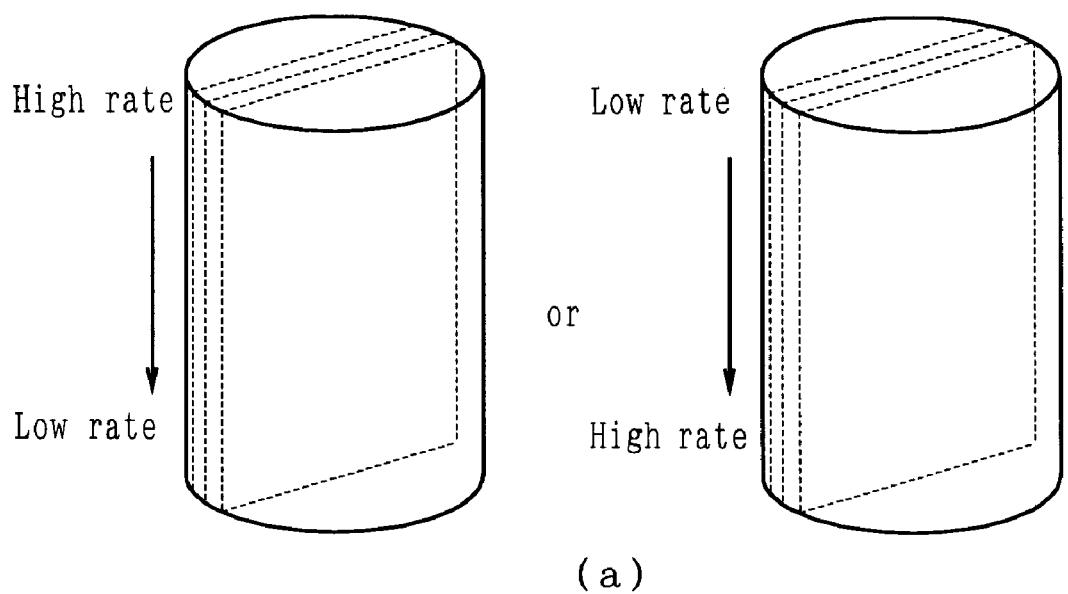
FIG. 19 illustrates how the measurement samples are prepared from a test ingot.
Figure 19:
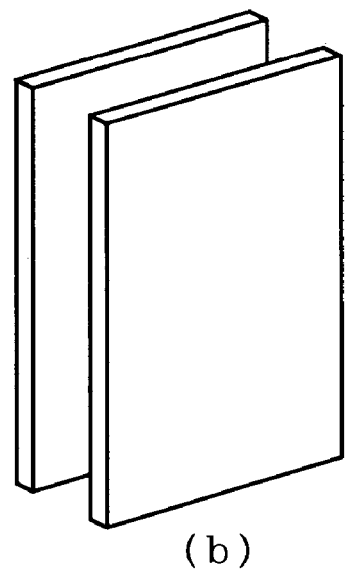

Next, with reference to FIGS. 16 and 19, a fifth identification method of the present invention is described.

As shown in FIG. 16, first and second measurement samples are prepared from a test ingot at first. Specifically, an ingot is pulled from a silicon melt stored in a quartz crucible of pulling equipment according to a CZ method or an MCZ method. In pulling the ingot, a pull rate V (mm/minute) of the ingot is varied either from a high rate (top side) to a low rate (bottom side) or from a low rate (bottom side) to a high rate (top side) so that the region [V], the region [Pv], the region [Pi], and the region [I] are contained along the axial direction of the ingot. Subsequently, as shown in FIG. 19, the ingot obtained in the test is sliced in the axial direction and subjected to a mirror etching, whereby a measurement sample having a thickness of 500 to 2000 μm and a mirror-finished surface is prepared.

Figure 22:
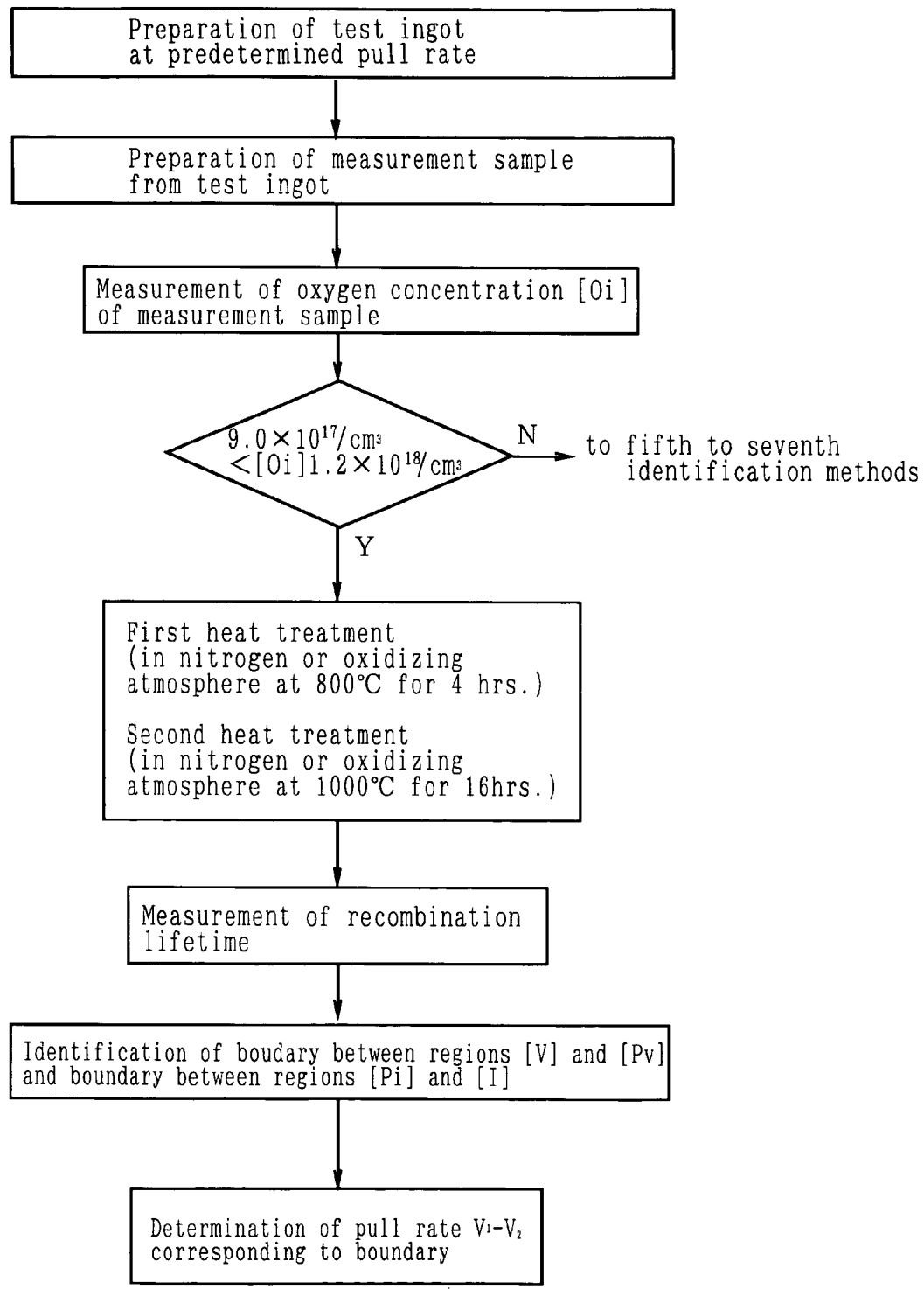
FIG. 22 is a flowchart pertaining to a measurement sample in a conventional identification method.
Figure 23:
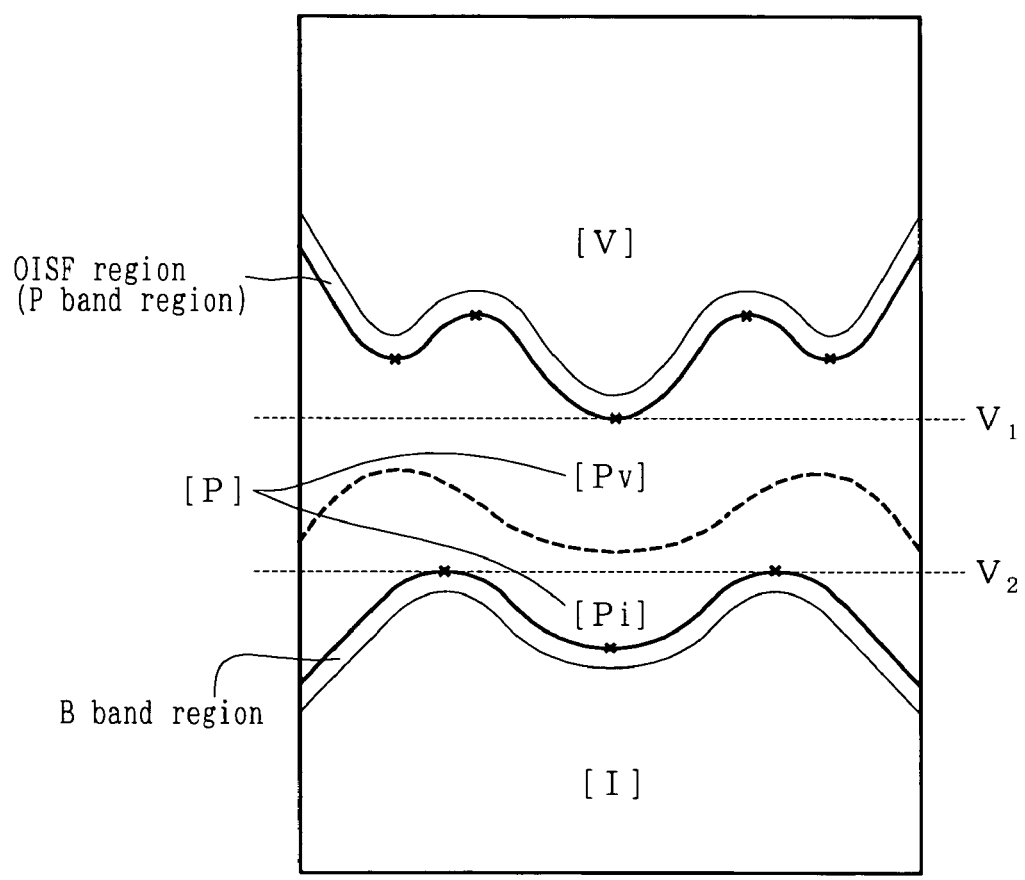
FIG. 23 is a view showing a recombination lifetime in an entire sample when the conventional identification method is performed.

Next, returning to FIG. 16, the concentrations of oxygen dissolved in the first and second samples are measured using an FT-IR (Fourier transform infrared absorption spectroscopy) method. When the oxygen concentrations of the first and second samples are $1.2 \times 10^{18}$ atoms/cm$^3$ or higher, the first sample is subjected to a first heat treatment at 800° C. for 4 hours in a nitrogen or oxidizing atmosphere and subsequently subjected to a second heat treatment at 1000° C. for 16 hours. When the concentrations of oxygen dissolved in the first and second samples fall out of the foregoing range, an identification method is carried out as follows. When the oxygen concentration is $9.0 \times 10^{17}$ atoms/cm$^3$ or lower, a later-described sixth identification method or a later-described seventh identification method is used. When the oxygen concentration is in the range of less than $1.2 \times 10^{18}$ atoms/cm$^3$ and greater than $9.0 \times 10^{17}$ atoms/cm$^3$, the recombination lifetime is measured after performing first and second heat treatments, as have been conventionally carried out, as shown in FIG. 22, whereby the boundary between the region [V] and the region [Pv] as well as the boundary between the region [Pi] and the region [I] can be clearly distinguished, as shown in FIG. 23.

In the sample having an oxygen concentration of $1.2 \times 10^{18}$ atoms/cm$^3$ or higher, the boundary between the region [V] and the region [Pv] cannot be clearly identified from the measurement result of the recombination lifetime even when the recombination lifetime of the sample is measured after performing the first and second heat treatments. This is because, in the sample having an oxygen concentration of $1.2 \times 10^{18}$ atoms/cm$^3$ or higher, oxygen precipitation nucleus tend to form easily and therefore the boundary between the region [V] and the region [Pv] becomes difficult to find.

Figure 20:
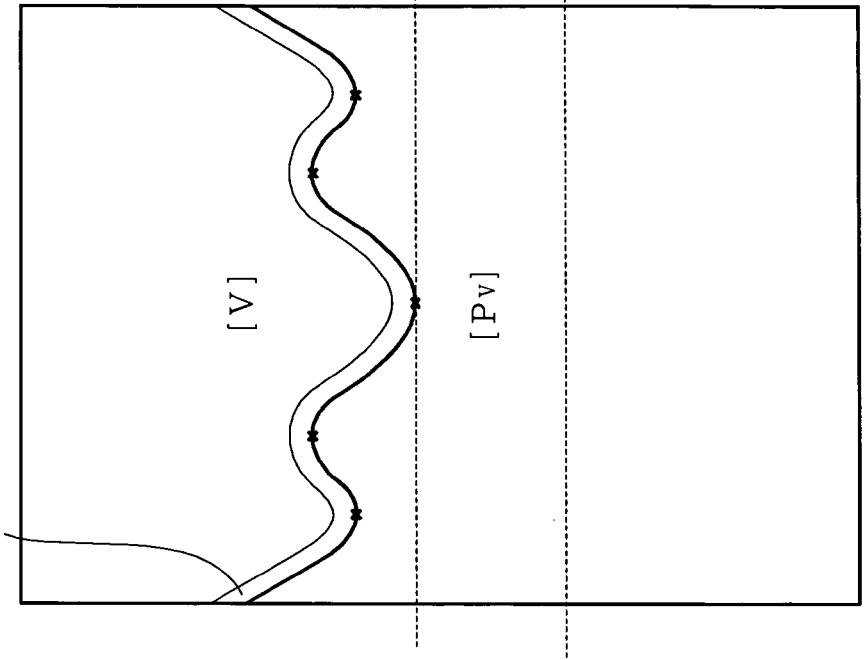
FIG. 20($a$) is a figure showing a recombination lifetime in the entire first sample that has undergone a second heat treatment in the fifth identification method, and FIG. 20($b$) is a figure showing a recombination lifetime in the entire second sample that has undergone a third heat treatment in the fifth identification method.
Figure 20:
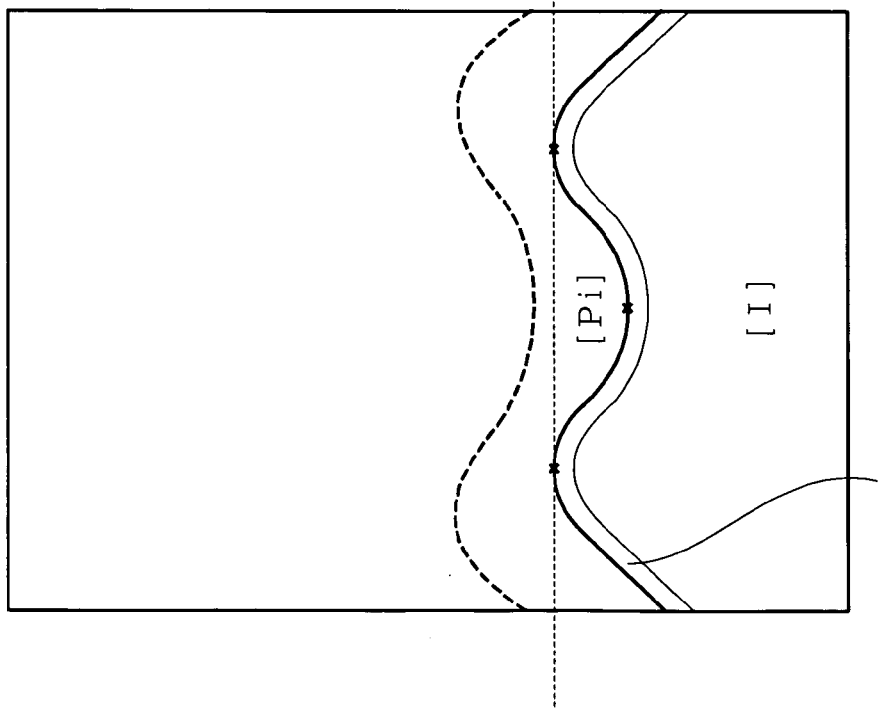

In view of this, the identification method according to the present invention subjects the first sample to the first and second heat treatments, and measures the recombination lifetime of the treated first sample to define the boundary between the region [Pi] and the region [I] as shown in FIG. 20(*a*). Next, the second sample is subjected to a third heat treatment at 1100 to 1200° C. for 1 to 4 hours in an oxidizing atmosphere. This third heat treatment exposes OISF. The second sample that has undergone the third heat treatment is subjected to a selective etching without stirring. The portion that has been selectively etched is observed with an optical microscope, and thereby, the boundary of the region [V] and the region [Pv] can be easily identified using the optical microscope because of the OISF distribution that is exposed, as shown in FIG. 20(*b*). Examples of the selective etching include Secco etching and non-chromium etching.

Among the inflection points at the boundary between the region [Pi] and the region [I], which are indicated by crosses (x) in FIG. 20(*a*), a pull rate $V_2$ is determined from the location of the inflection point that is closest to the region [V]. Likewise, among the inflection points at the boundary between the region [V] and the region [Pv], which are indicated by crosses (x) in FIG. 20(*b*), a pull rate $V_1$ is determined from the location of the inflection point that is closest to the region [I]. By pulling an ingot with a pull rate being within the range of $V_1$ to $V_2$, it is possible to fabricate an ingot having a perfect region [P] in which vacancy agglomerates and interstitial silicon agglomerates do not exist, that is, a grown-in defect-free region.

(7) Sixth Identification Method According to the Present Invention

Figure 17:
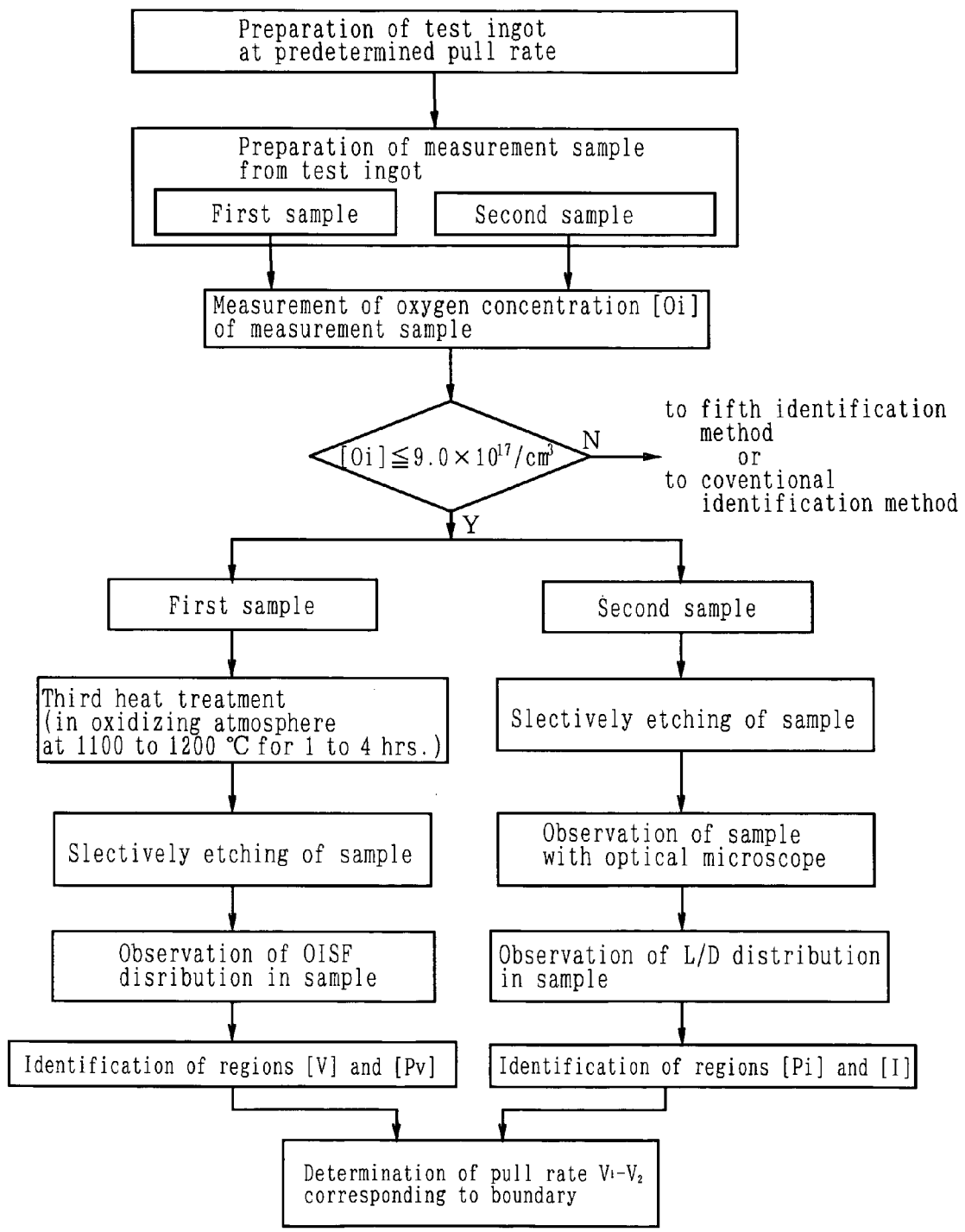
FIG. 17 is a flowchart pertaining to measurement samples in a sixth identification method according to the present invention.

As shown in FIG. 17, first and second measurement samples are prepared from a test ingot at first. Specifically, an ingot is pulled from a silicon melt stored in a quartz crucible of pulling equipment according to a CZ method or an MCZ method. In pulling the ingot, a pull rate V (mm/minute) of the ingot is varied either from a high rate (top side) to a low rate (bottom side) or from a low rate (bottom side) to a high rate (top side) so that the region [V], the region [Pv], the region [Pi], and the region [I] are contained along the axial direction of the ingot. Subsequently, as shown in FIG. 19, the obtained test ingot is sliced in the axial direction and is subjected to a mirror etching, whereby measurement samples having a thickness of 500 to 2000 μm and a mirror-finished surface are prepared.

Next, returning to FIG. 17, the concentrations of oxygen dissolved in the first and second samples are measured using the FT-IR (Fourier transform infrared absorption spectroscopy) method. When the oxygen concentrations are $9.0 \times 10^{17}$ atoms/cm$^3$ or lower, the first sample is subjected to a third heat treatment at 1100 to 1200° C. for 1 to 4 hours in an oxidizing atmosphere. When the concentrations of oxygen dissolved in the first and second samples fall out of the foregoing range, an identification method is carried out as follows. When the oxygen concentration is $1.2 \times 10^{18}$ atoms/cm$^3$ or higher, the fifth identification method is performed. When the oxygen concentration is in the range of less than $1.2 \times 10^{18}$ atoms/cm$^3$ and greater than $9.0 \times 10^{17}$ atoms/cm$^3$, the previously-described conventional identification method is carried out. For the sample having an oxygen concentration of $9.0 \times 10^{17}$ atoms/cm$^3$ or lower, the boundary between the region [Pi] and the region [I] cannot be clearly identified from the result of measuring the recombination lifetime even when the recombination lifetime of the sample is measured after performing the first and second heat treatments. This is because, in the sample having an oxygen concentration of $9.0 \times 10^{17}$ atoms/cm$^3$ or lower, oxygen precipitation nucleus are not likely to form by performing only the first and second heat treatments and therefore the boundary between the region [Pi] and the region [I] becomes difficult to find.

OISF is exposed by performing this third heat treatment. The first sample that has undergone the third heat treatment is subjected to a selective etching. The portion that has been subjected to the selective etching is observed with an optical microscope, and thereby, the boundary of the region [V] and the region [Pv] can be easily identified using the optical microscope because of the OISF distribution that is exposed, as shown in FIG. 21(*a*).

Figure 21:
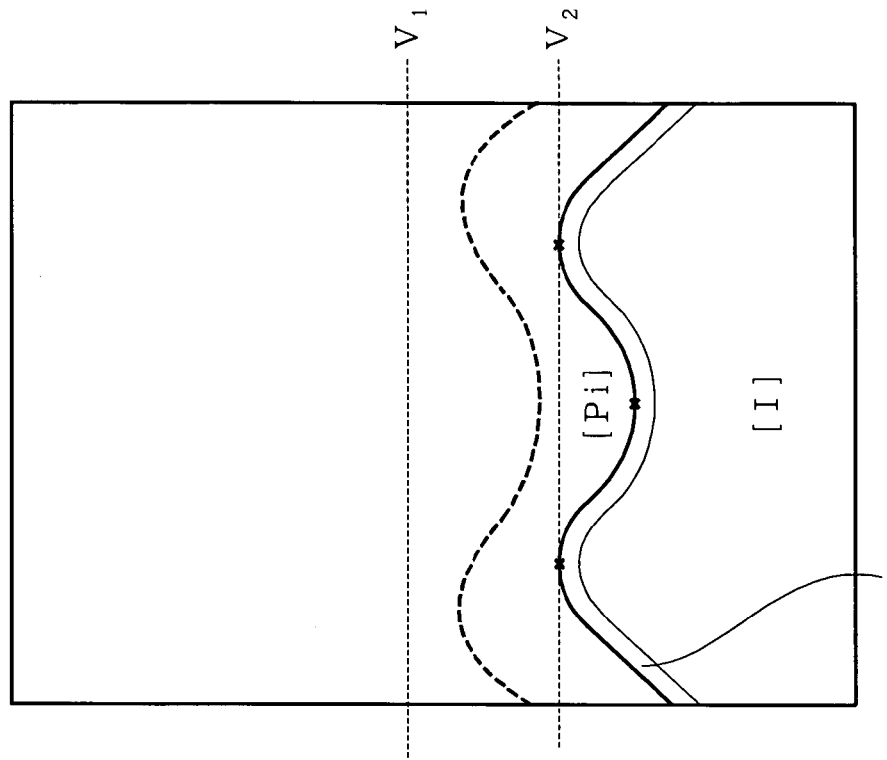
FIG. 21($a$) is a figure showing a recombination lifetime in the entire first sample that has undergone a third heat treatment in the sixth identification method, and FIG. 21($b$) is a figure showing a L/D distribution in the entire second sample in the sixth identification method.
Figure 21:
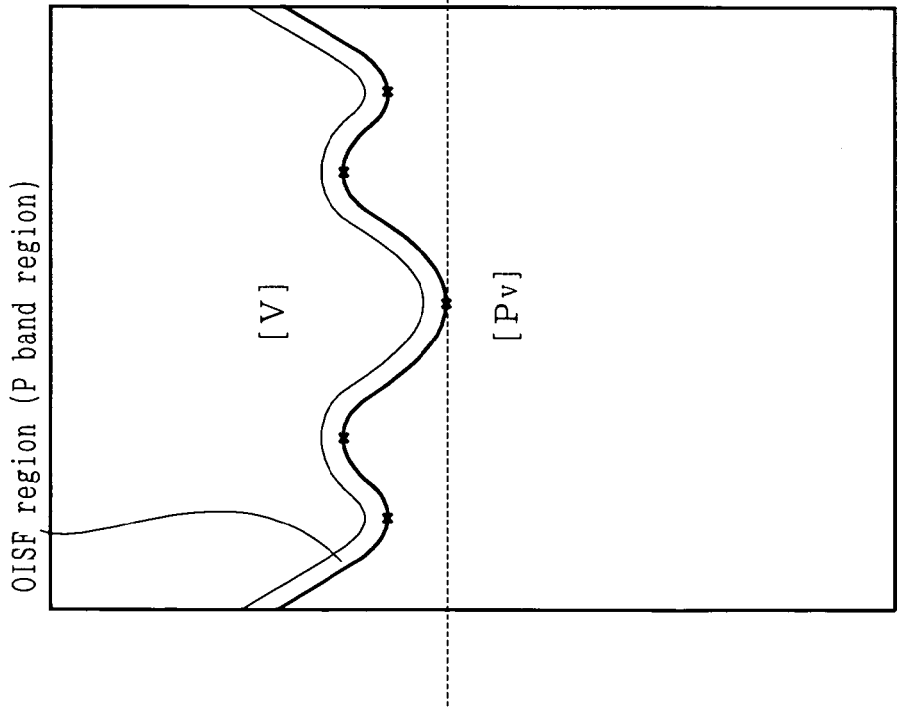

Next, the second sample is subjected to a selective etching, and by observing the portion that has been subjected to the selective etching with an optical microscope, the B band region exhibiting L/D can be identified as shown in FIG. 21(*b*).

Among the inflection points at the boundary between the region [V] and the region [Pv], which are indicated by crosses (x) in FIG. 21(*a*), a pull rate $V_1$ is determined from the location of the inflection point that is closest to the region [I]. Likewise, among the inflection points at the boundary between the region [Pi] and the region [I], which are indicated by crosses (x) in FIG. 21(b), a pull rate $V_2$ is determined from the location of the inflection point that is closest to the region [V]. By pulling an ingot with a pull rate within the range of $V_1$ to $V_2$, it is possible to fabricate an ingot with a perfect region [P] in which vacancy agglomerates and interstitial silicon agglomerates do not exist, that is, a grown-in defect-free region.

(8) Seventh Identification Method according to the Present Invention

A seventh identification method is a method used at a similar oxygen concentration to that in the sixth identification method.

Figure 18:
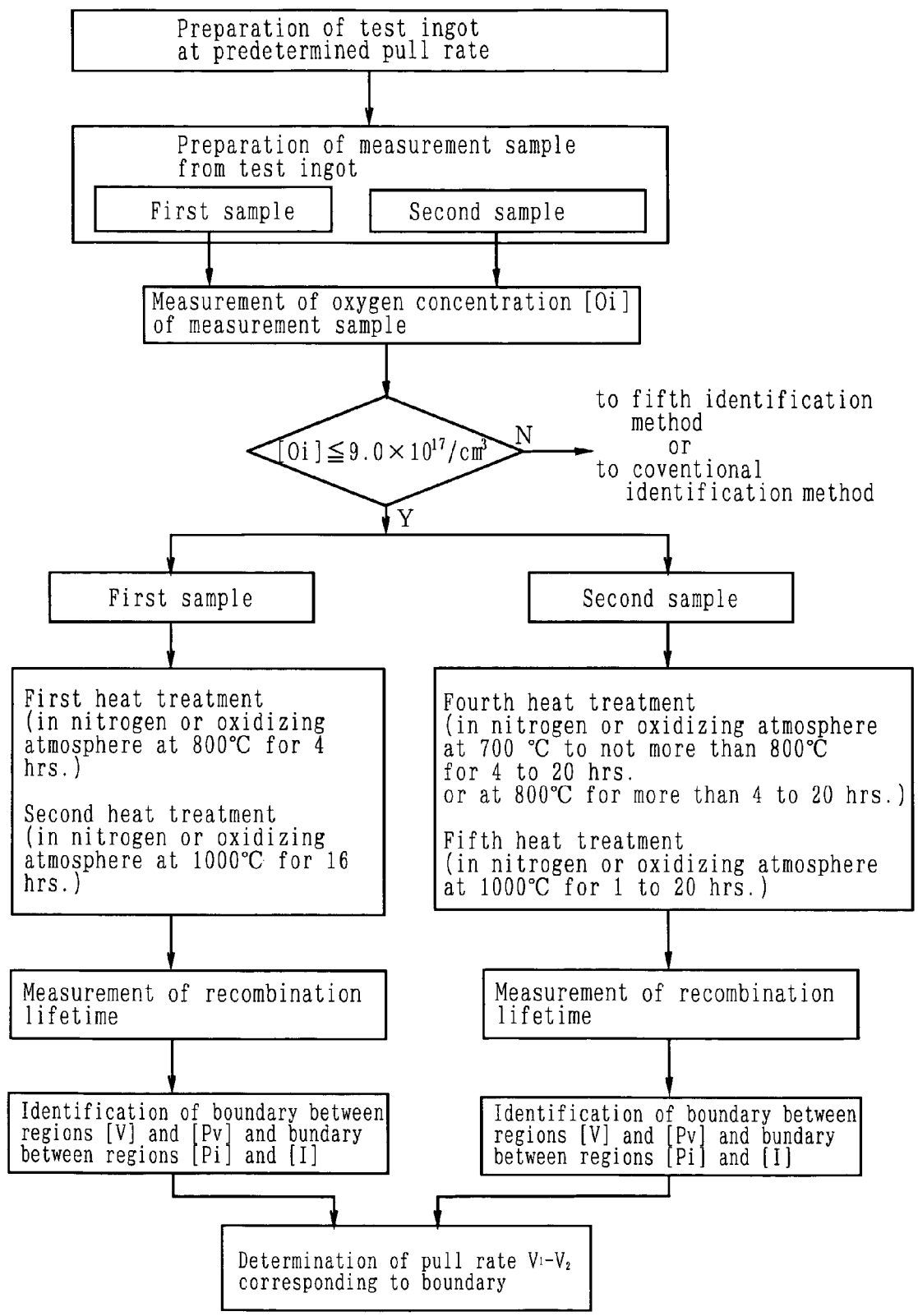
FIG. 18 is a flowchart pertaining to measurement samples in a seventh identification method according to the present invention.

As shown in FIG. 18, first and second measurement samples are prepared from a test ingot at first. Specifically, an ingot is pulled from a silicon melt stored in a quartz crucible of pulling equipment according to a CZ method or an MCZ method. In pulling the ingot, a pull rate V (mm/minute) of the ingot is varied either from a high rate (top side) to a low rate (bottom side) or from a low rate (bottom side) to a high rate (top side) so that the region [V], the region [Pv], the region [Pi], and the region [I] are contained along the axial direction of the ingot. Subsequently, as shown in FIG. 19, the obtained test ingot is sliced in the axial direction and is subjected to a mirror etching, whereby measurement samples having a thickness of 500 to 2000 µm and a mirror-finished surface are prepared.

Next, returning to FIG. 18, the concentrations of oxygen dissolved in the first and second samples are measured using the FT-IR (Fourier transform infrared absorption spectroscopy) method. When the oxygen concentration is $9.0 \times 10^{17}$ atoms/cm$^3$ or lower, the first sample is subjected to a first heat treatment at 800° C. for 4 hours in a nitrogen or oxidizing atmosphere, and subsequently is subjected to a second heat treatment at 1000° C. for 16 hours. By measuring the recombination lifetime in the first sample, the boundary between the region [V] and the region [Pv] as well as the boundary between the region [Pi] and the region [I] are defined. When the boundary between the region [Pi] and the region [I] cannot be sufficiently distinguished, the second sample is subjected to a fourth heat treatment at 700° C. to not more than 800° C. for 4 to 20 hours or at 800° C. for more than 4 to 20 hours in a nitrogen or oxidizing atmosphere and subsequently is subjected to a fifth heat treatment at 1000° C. for 1 to 20 hours. When the oxygen concentration is low and oxygen precipitation nucleus do not grow at 800° C. in this way, the boundary between the region [Pi] and the region [I] can be more easily distinguished by performing the fourth and fifth heat treatments. By measuring again the recombination lifetime for the second sample that has undergone the fifth heat treatment, the boundary between the region [Pi] and the region [I] can be identified since the heat treatment condition is expanded to lower temperatures.

INDUSTRIAL APPLICABILITY

With the first to third identification methods according to the present invention, a region [Pv] and a region [Pi] as well as the boundary thereof within an ingot can be measured with high precision so that point defect regions can be easily identified even when the concentration of oxygen dissolved in the ingot is low. As a result, a silicon single crystal ingot having a perfect region [P] can be easily fabricated, and a silicon wafer composed of the perfect region [P] can be easily obtained from the ingot.

With the fifth identification method according to the present invention, the boundary between a region [Pv] and a region [V] within an ingot can be easily identified even when the oxygen dissolved in the ingot is high in concentration. Moreover, with the sixth and seventh identification methods according to the present invention, the boundary between the region [V] and the region [Pv] as well as the boundary between the region [Pi] and the region [I] within an ingot can be easily identified even in the case of low concentrations. As a result, a silicon single crystal ingot having a perfect region [P] can be easily fabricated, and a silicon wafer composed of the perfect region [P] can be easily obtained from the ingot.

What is claimed is:

1. A method of identifying a point defect distribution in a silicon single crystal ingot, comprising the steps of:
    (a) slicing a first silicon single crystal ingot in an axial direction thereof, the ingot pulled from a first silicon melt at a varying pull rate, to prepare a reference sample including a region [V], a region [Pv], a region [Pi], and a region [I];
    (b) coating a surface of the reference sample with a transition metal solution in which a transition metal is dissolved at a concentration of 1 to 1000 ppm to metal-contaminate the reference sample;
    (c) heat-treating the metal-contaminated reference sample in an atmosphere of argon, nitrogen, oxygen, hydrogen, or a mixed gas thereof either at temperatures of 600 to 1200° C. for 0.5 to 24 hours while increasing the temperature at a rate of 0.5 to 10° C./minute, or at temperatures of 600 to 1100° C. for 10 to 60 seconds while increasing the temperature at a rate of 30 to 70° C./second, to diffuse the transition metal in the reference sample;
    (d) measuring a concentration of recombination centers formed by the transition metal in the entire heat-treated reference sample;
    (e) measuring recombination lifetimes associated with the transition metal in the entire heat-treated reference sample;
    (f) producing a correlation line between the concentration of recombination centers and the recombination lifetimes from measurement results obtained in the step (d) and the step (e), and defining regions including at least the region [Pv] and the region [P] as well as a boundary thereof in the reference sample;
    (g) slicing a second silicon single crystal ingot, in an axial direction thereof, the second silicon single crystal ingot pulled from a second silicon melt at a predetermined pull rate, to prepare a measurement sample including at least a region [Pv] and a region [Pi];
    (h) coating a surface of the measurement sample with the same transition metal solution as the transition metal solution to metal-contaminate the measurement sample;
    (i) heat-treating the metal-contaminated measurement sample under the same conditions as those in the step (c) to diffuse the transition metal in the measurement sample;
    (j) measuring a recombination lifetime associated with the transition metal in the entire heat-treated measurement sample; and
    (k) checking results of the measuring in the step (j) against the correlation line to infer the region [Pv] and the region [Pi] as well as a boundary thereof;
    wherein the reference sample and the measurement sample that have been sliced are such that an oxygen concentration thereof is within the range of $8.0 \times 10^{17}$ to $1.0 \times 10^{18}$ atoms/cm$^3$, or that a boundary between the region [Pv] and the region [Pi] is unidentifiable in the samples when their recombination lifetimes are measured after the samples are heat-treated at 800° C. for 4 hours in a nitrogen atmosphere and subsequently further heat-treated at 1000° C. for 16 hours; and wherein the region [V] is a region in which vacancy-type point defects are predominant and defects in which excessive vacancies are agglomerated are contained, the region [Pv] is a region in which vacancy-type point defects are predominant and defects in which vacancies are agglomerated are not contained, the region [Pi] is a region in which interstitial silicon-type point defects are predominant and defects in which interstitial silicons are agglomerated are not contained, and the region [I] is a region in which interstitial silicon-type point defects are predominant and defects in which interstitial silicons are agglomerated are contained.

2. The method according to claim 1, wherein the transition metal is Fe, Ni, Cu, or Co.

3. The method according to claim 1, wherein the concentration of recombination centers formed in the silicon single crystal by the heat-treating for diffusing the transition metal is measured using a DLTS (deep level transient spectroscopy) method.

4. The method according to claim 1, wherein the recombination lifetimes subsequent to the heat-treating for diffusing the transition metal is measured using an LM-PCD (laser/microwave photoconductivity decay) method.

5. A method of identifying a point defect distribution in a silicon single crystal ingot, comprising the steps of:
(a) slicing a first silicon single crystal ingot in an axial direction thereof, the first silicon single crystal ingot pulled from a first silicon melt at a varying pull rate, to prepare first and second reference samples each including a region [V], a region [Pv], a region [Pi], and a region [I];
(b) coating each of the surfaces of the first and second reference samples with a first and second transition metal solutions in which respective different transition metals are dissolved at a concentration of 1 to 1000 ppm to metal-contaminate the reference samples;
(c) heat-treating the metal-contaminated first and second reference samples in an atmosphere of argon, nitrogen, oxygen, hydrogen, or a mixed gas thereof either at temperatures of 600 to 1200° C. for 0.5 to 24 hours while increasing the temperature at a rate of 0.5 to 10° C./minute, or at temperatures of 600 to 1100° C. for 10 to 60 seconds while increasing the temperature at a rate of 30 to 70° C./second, to diffuse the transition metals in the first and second reference samples;
(d) measuring a concentration of recombination centers formed by the transition metal in the entire heat-treated first reference sample;
(e) measuring recombination lifetimes associated with the transition metal in the entire heat-treated second reference sample;
(f) producing a correlation line between the concentration of recombination centers and the recombination lifetimes from measurement results obtained in the step (d) and the step (e), and defining regions including at least the region [Pv] and the region [Pi] as well as a boundary thereof in the first reference sample;
(g) slicing a second silicon single crystal ingot in an axial direction thereof, the second silicon single crystal ingot pulled from a second silicon melt at a predetermined pull rate, to prepare a measurement sample including at least a region [Pv] and a region [Pi];
(h) coating a surface of the measurement sample with a third transition metal solution that is the same as the second transition metal solution to metal-contaminate the measurement sample;
(i) heat-treating the metal-contaminated measurement sample under the same conditions as those in the step (c) to diffuse the transition metal in the measurement sample;
(j) measuring a recombination lifetime associated with the transition metal in the entire heat-treated measurement sample; and
(k) checking results of the measuring in the step (j) against the correlation line to infer the region [Pv] and the region [Pi] as well as a boundary thereof;

wherein the first and second reference samples and the measurement sample that have been sliced are such that an oxygen concentration thereof is within the range of $8.0 \times 10^{17}$ to $1.0 \times 10^{18}$ atoms/cm$^3$, or that the boundary between the region [Pv] and the region [Pi] is unidentifiable in the samples when their recombination lifetimes are measured after the samples are heat-treated at 800° C. for 4 hours in a nitrogen atmosphere and subsequently further heat-treated at 1000° C. for 16 hours; and wherein the region [V] is a region in which vacancy-type point defects are predominant and defects in which excessive vacancies are agglomerated are contained, the region [Pv] is a region in which vacancy-type point defects are predominant and defects in which vacancies are agglomerated are not contained, the region [Pi] is a region in which interstitial silicon-type point defects are predominant and defects in which interstitial silicons are agglomerated are not contained, and the region [I] is a region in which interstitial silicon-type point defects are predominant and defects in which interstitial silicons are agglomerated are contained.

6. The method according to claim 5, wherein the transition metal is Fe, Ni, Cu, or Co.

7. The method according to claim 6, wherein, when the transition metal is Ni or Co, a second reference sample and the measurement sample are chemically etched at a thickness within the range of 500 to 1000 μm after the second reference sample and the measurement sample have been coated with the solution in which Ni or Co is dissolved and have been heat-treated, and their recombination lifetimes associated with the transition metal are measured before and after the chemical etching of the second reference sample and the measurement sample.

8. The method according to claim 6, wherein the first reference sample is coated with a solution in which Fe is dissolved, and the second reference sample and the measurement sample are coated with a solution in which Ni or Co is dissolved.

9. The method according to claim 5, wherein the concentration of recombination centers formed in the silicon single crystal by the heat-treating for diffusing the transition metal is measured using a DLTS (deep level transient spectroscopy) method.

10. The method according to claim 5, wherein the recombination lifetimes subsequent to the heat-treating for diffusing the transition metal is measured using an LM-PCD (laser/microwave photoconductivity decay) method.

11. A method of identifying a point defect distribution in a silicon single crystal ingot, comprising the steps of:
(a) slicing a silicon single crystal ingot in an axial direction thereof, the ingot pulled from a silicon melt at a varying pull rate, to prepare first and second samples each including a region [V], a region [Pv], a region [Pi], and a region [I];

(b) measuring oxygen concentrations of the first and second samples;

(c) subjecting the first sample to a first heat treatment at 800° C. for 4 hours in a nitrogen or oxidizing atmosphere and subsequently to a second heat treatment at 1000° C. for 16 hours, when the oxygen concentrations of the first and second samples are $1.2 \times 10^{18}$ atoms/cm$^3$ or higher;

(d) measuring recombination lifetimes in the entire heat-treated first sample;

(e) defining a boundary between the region [Pi] and the region [I] in the first sample based on measurement results in the step (d);

(f) subjecting the second sample to a third heat treatment at 1100 to 1200° C. for 1 to 4 hours in an oxidizing atmosphere;

(g) selectively etching the second sample subjected to the third heat treatment;

(h) observing the selectively-etched second sample with an optical microscope to identify an oxidation induced stacking fault (OISF) region; and (i) defining a boundary between the region [V] and the region [Pv] in the second sample based on a result of the observing in the step (h);

wherein the region [V] is a region in which vacancy-type point defects are predominant and defects in which excessive vacancies are agglomerated are contained, the region [Pv] is a region in which vacancy-type point defects are predominant and defects in which vacancies are agglomerated are not contained, the region [Pi] is a region in which interstitial silicon-type point defects are predominant and defects in which interstitial silicons are agglomerated are not contained, and the region [I] is a region in which interstitial silicon-type point defects are predominant and defects in which interstitial silicons are agglomerated are contained.

12. A method of identifying a point defect distribution in a silicon single crystal ingot, comprising the steps of:

(a) slicing a silicon single crystal ingot in an axial direction thereof, the ingot pulled from a silicon melt at a varying pull rate, to prepare first and second samples each including a region [V], a region [Pv], a region [Pi], and a region [I];

(b) measuring oxygen concentrations of the first and second samples;

(c) subjecting the first sample to a third heat treatment at 1100 to 1200° C. for 1 to 4 hours in an oxidizing atmosphere when the oxygen concentrations of the first and second samples are $9.0 \times 10^{17}$ atoms/cm$^3$ or lower;

(d) selectively etching the first sample that has been subjected to the third heat treatment;

(e) observing the selectively-etched first sample with an optical microscope to identify an oxidation induced stacking fault (OISF) region;

(f) defining a boundary between the region [V] and the region [Pv] in the first sample based on a result of the observing in the step (e);

(g) selectively etching the second sample;

(h) observing the selectively-etched second sample with an optical microscope to identify an interstitial-type large dislocation region; and (i) defining a boundary between the region [Pi] and the region [I] in the second sample based on a result of the observing in the step (h);

wherein the region [V] is a region in which vacancy-type point defects are predominant and defects in which excessive vacancies are agglomerated are contained, the region [Pv] is a region in which vacancy-type point defects are predominant and defects in which vacancies are agglomerated are not contained, the region [Pi] is a region in which interstitial silicon-type point defects are predominant and defects in which interstitial silicons are agglomerated are not contained, and the region [I] is a region in which interstitial silicon-type point defects are predominant and defects in which interstitial silicons are agglomerated are contained.

13. A method of identifying a point defect distribution in a silicon single crystal ingot, comprising the steps of:

(a) slicing a silicon single crystal ingot in an axial direction thereof, the ingot pulled from a silicon melt at a varying pull rate, to prepare first and second samples each including a region [V], a region [Pv], a region [Pi], and a region [I];

(b) measuring oxygen concentrations of the first and second samples;

(c) subjecting the first sample to a first heat treatment at 800° C. for 4 hours in a nitrogen or oxidizing atmosphere and subsequently to a second heat treatment at 1000° C. for 16 hours, when the oxygen concentrations of the first and second samples are $9.0 \times 10^{17}$ atoms/cm$^3$ or less;

(d) measuring recombination lifetimes in the entire heat-treated first sample;

(e) defining a boundary between the region [Pi] and the region [I] and a boundary between the region [V] and the region [Pv] in the first sample based on measurement results in the step (d);

(f) subjecting the second sample to a fourth heat treatment at 700° C. to not more than 800° C. for 4 to 20 hours or at 800° C. for more than 4 to 20 hours in a nitrogen or oxidizing atmosphere and subsequently to a fifth heat treatment at 1000° C. for 1 to 20 hours;

(g) measuring recombination lifetimes in the entire heat-treated second sample; and (h) defining a boundary between the region [Pi] and the region [I] and a boundary between the region [V] and the region [Pv] in the second sample based on measurement results in the step (g);

wherein the region [V] is a region in which vacancy-type point defects are predominant and defects in which excessive vacancies are agglomerated are contained, the region [Pv] is a region in which vacancy-type point defects are predominant and defects in which vacancies are agglomerated are not contained, the region [Pi] is a region in which interstitial silicon-type point defects are predominant and defects in which interstitial silicons are agglomerated are not contained, and the region [I] is a region in which interstitial silicon-type point defects are predominant and defects in which interstitial silicons are agglomerated are contained.

* * * * *